(12) United States Patent
Kobayashi

(10) Patent No.: US 10,304,767 B2
(45) Date of Patent: May 28, 2019

(54) SEMICONDUCTOR DEVICE

(71) Applicant: Renesas Electronics Corporation, Tokyo (JP)

(72) Inventor: Tatsuya Kobayashi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/955,090

(22) Filed: Apr. 17, 2018

(65) Prior Publication Data

US 2018/0315691 A1 Nov. 1, 2018

(30) Foreign Application Priority Data

Apr. 26, 2017 (JP) ................................. 2017-087300

(51) Int. Cl.
*H01L 23/48* (2006.01)
*H01L 23/498* (2006.01)
(Continued)

(52) U.S. Cl.
CPC ...... *H01L 23/49838* (2013.01); *H01L 21/561* (2013.01); *H01L 21/565* (2013.01); *H01L 21/78* (2013.01); *H01L 23/3128* (2013.01); *H01L 23/49816* (2013.01); *H01L 23/49827* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 24/97* (2013.01); *H01L 2224/32225* (2013.01); *H01L 2224/48091*
(2013.01); *H01L 2224/48106* (2013.01); *H01L 2224/48227* (2013.01); *H01L 2224/73265* (2013.01);
(Continued)

(58) Field of Classification Search
None
See application file for complete search history.

(56) References Cited

U.S. PATENT DOCUMENTS 5,691,568 A * 11/1997 Chou ................ H01L 23/49822
257/691
7,538,442 B2 * 5/2009 Nakanishi ........... H01L 23/3114
257/773
(Continued)

FOREIGN PATENT DOCUMENTS

JP 2009-302227 A 12/2009
JP 2010-093109 A 4/2010

*Primary Examiner* — Kevin M Picardat
(74) *Attorney, Agent, or Firm* — Mattingly & Malur, PC

(57) ABSTRACT

An object of the present invention is to improve the degree of freedom in the wiring design of a wiring substrate configuring a semiconductor device. Lands having an NSMD structure and a land-on-through-hole structure are arranged at positions not overlapping with a plurality of leads arranged on a chip loading surface of a wiring substrate in transparent plan view on the outer peripheral side of a mounting surface of the wiring substrate configuring a semiconductor device having a BGA package structure. On the other hand, land parts having the NSMD structure and to which lead-out wiring parts are connected are arranged at positions overlapping with the leads arranged on the chip loading surface of the wiring substrate in transparent plan view on the inner side than the group of lands in the mounting surface of the wiring substrate.

18 Claims, 19 Drawing Sheets

(51) Int. Cl.
  *H01L 23/00* (2006.01)
  *H01L 23/31* (2006.01)
  *H01L 21/78* (2006.01)
  *H01L 21/56* (2006.01)
  *H05K 1/11* (2006.01)
  *H05K 1/18* (2006.01)

(52) U.S. Cl.
  CPC .............. *H01L 2224/85013* (2013.01); *H01L 2224/92247* (2013.01); *H01L 2924/3512* (2013.01); *H05K 1/112* (2013.01); *H05K 1/181* (2013.01); *H05K 2201/10378* (2013.01); *H05K 2201/10734* (2013.01)

(56) References Cited

U.S. PATENT DOCUMENTS

| | | |
|---|---|---|
| 7,919,858 B2 | 4/2011 | Danno |
| 8,076,787 B2 | 12/2011 | Hayashi |
| 2005/0046023 A1* | 3/2005 | Takahashi ......... H01L 23/49838 257/734 |
| 2007/0271783 A1* | 11/2007 | Ikeda ..................... B32B 3/10 29/852 |
| 2010/0276189 A1* | 11/2010 | Song ..................... H01L 23/13 174/260 |
| 2013/0292815 A1* | 11/2013 | Tashiro ................. H01L 23/495 257/676 |
| 2016/0190058 A1* | 6/2016 | Takeda ................... H01L 24/48 257/774 |

\* cited by examiner

SEMICONDUCTOR DEVICE

CROSS-REFERENCE TO RELATED APPLICATIONS

The disclosure of Japanese Patent Application No. 2017-087300 filed on Apr. 26, 2017 including the specification, drawings and abstract is incorporated herein by reference in its entirety.

BACKGROUND

The present invention relates to a semiconductor device technique, and relates to a technique effective for applying, for example, a semiconductor device technique including a bump electrode.

For example, Japanese Unexamined Patent Application Publication No. 2009-302227 and Japanese Unexamined Patent Application Publication No. 2010-93109 describe a structure in which an electrode of a semiconductor chip mounted on a wiring substrate is extracted to the outside through a bump electrode arranged on a mounting surface of the wiring substrate.

Japanese Unexamined Patent Application Publication No. 2009-302227 discloses a land-on-via structure in which a via penetrating a wiring substrate is directly connected with a land where a bump electrode is formed, an NSMD (Non Solder Mask Defined) structure in which the land is included in an opening portion of a solder resist formed on a mounting surface of the wiring substrate, and an SMD (Solder Mask Defined) structure whose peripheral part is covered with the solder resist formed on the mounting surface of the wiring substrate.

Further, Japanese Unexamined Patent Application Publication No. 2010-93109 discloses a structure in which a group of solder balls arranged on the outer peripheral side of a mounting surface of a wiring substrate while being circulated in a plurality of rows and a group of solder balls arranged on the central side of the mounting surface of the wiring substrate while being circulated in a plurality of rows are provided on the mounting surface of the wiring substrate.

SUMMARY

By the way, there are many structures of lands (portions to which solder materials serving as external terminals are joined) of a wiring substrate used for a semiconductor device such as a BGA (Ball Grid Array) type or an LGA (Land Grid Array) type.

For example, in the NSMD structure (see FIGS. 10 and 11 of Japanese Unexamined Patent Application Publication No. 2009-302227), the peripheral part of the land is not covered with an insulating film (solder resist film), and the land and a part of a wiring (lead-out wiring) connected to the land are exposed from an opening portion formed in the insulating film. Further, for example, in the SMD structure (see FIGS. 12 and 13 of Japanese Unexamined Patent Application Publication No. 2009-302227), the peripheral part of the land and the wiring connected to the land are covered with the insulating film (solder resist film). In the NSMD structure and the SMD structure, a through-hole of the wiring substrate is formed at a position not overlapping with the land. Further, for example, as shown in FIGS. 18 and 19 of Japanese Unexamined Patent Application Publication No. 2009-302227, there is a land having the NSMD structure in which the peripheral part of the land is not covered with the insulating film and a so-called land-on-through-hole structure (land-on-via structure) in which the through-hole (via) of the wiring substrate is formed at a position overlapping with the land, or a land having the SMD structure in which the peripheral part of the land is covered with the insulating film and the so-called land-on-through-hole structure in which the through-hole of the wiring substrate is formed at a position overlapping with the land.

Here, in the case of the land-on-via structure, since there is no wiring connected to the land in the same layer as the land, the solder material bonded to the land can be brought into contact with not only the upper surface of the land but also the side surface of the land intersecting with the upper surface. Thus, the land-on-via structure is the most excellent in thermal stress resistance among the above-described structure proposals. However, according to the study by the inventors, the inventors found that if the land-on-via structure was adopted for all the lands, it was difficult to route a plurality of wirings connecting a plurality of leads (bonding leads or bonding fingers) arranged on the upper surface (loading surface of a semiconductor chip) of the wiring substrate to a plurality of lands arranged on the lower surface (mounting surface) of the wiring substrate.

The other problems and novel features will become apparent from the description of the specification and the accompanying drawings.

In a semiconductor device according one embodiment, lands having an NSMD structure and a land-on-through-hole structure are arranged at positions not overlapping with a plurality of leads arranged on a chip loading surface of a wiring substrate in transparent plan view on the outer peripheral side of a mounting surface of the wiring substrate. On the other hand, land parts having the NSMD structure and to which lead-out wiring parts are connected are arranged at positions overlapping with the leads arranged on the chip loading surface of the wiring substrate in transparent plan view on the inner side than the group of lands having the land-on-through-hole structure arranged on the mounting surface of the wiring substrate.

Further, in a semiconductor device according one embodiment, lands having an NSMD structure and a land-on-through-hole structure are arranged in a first area not overlapping with a plurality of leads arranged on a chip loading surface of a wiring substrate in transparent plan view on the outer peripheral side of a mounting surface of the wiring substrate. On the other hand, land parts having the NSMD structure and to which lead-out wiring parts are connected are arranged in a second area overlapping with the leads arranged on the chip loading surface of the wiring substrate in transparent plan view on the inner side than the first area of the mounting surface of the wiring substrate.

According to one embodiment, it is possible to improve the degree of freedom in the wiring design of a wiring substrate configuring a semiconductor device.

Figure 8:
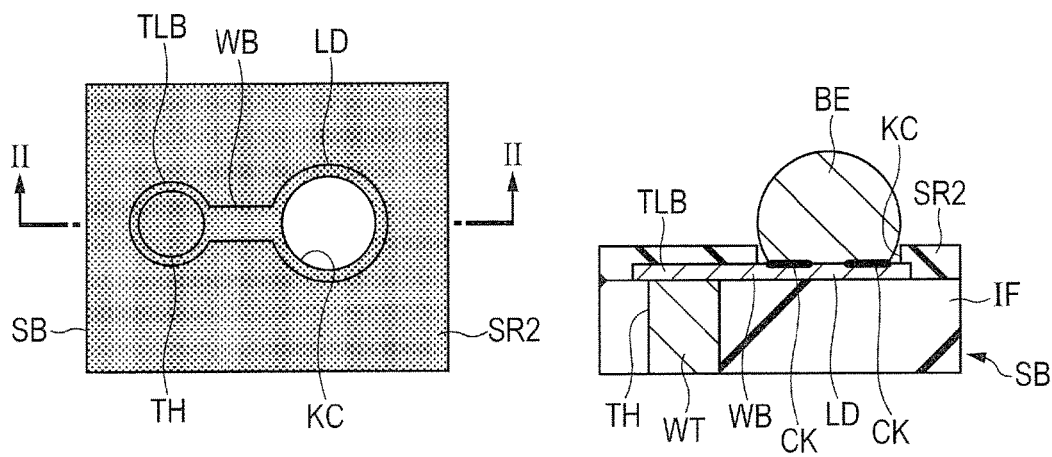

The left side of FIG. 8 is a plan view of a land having the SMD structure, and the right side of FIG. 8 is a partial cross-sectional view taken along the line II-II on the left side of FIG. 8.

Figure 9:
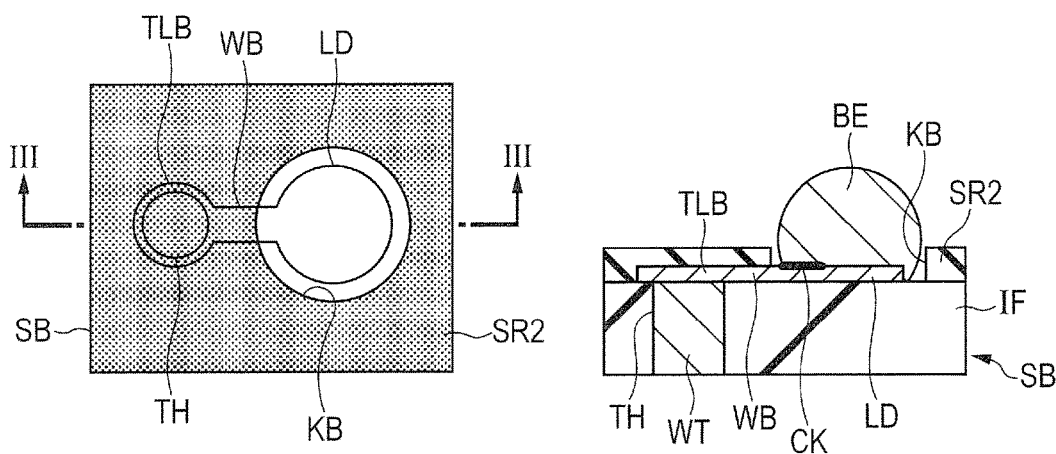

The left side of FIG. 9 is a plan view of the land having the NSMD structure, and the right side of FIG. 9 is a partial cross-sectional view taken along the line on the left side of FIG. 9.

Figure 10:
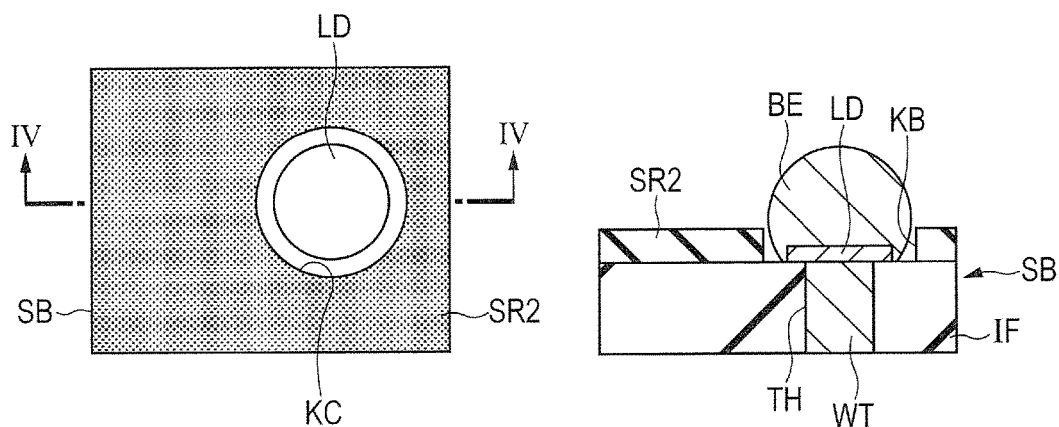

The left side of FIG. 10 is a plan view of the land having the NSMD structure and the land-on-through-hole structure (land-on-via structure), and the right side of FIG. 10 is a partial cross-sectional view taken along the line IV-IV on the left side of FIG. 10.

Figure 11:
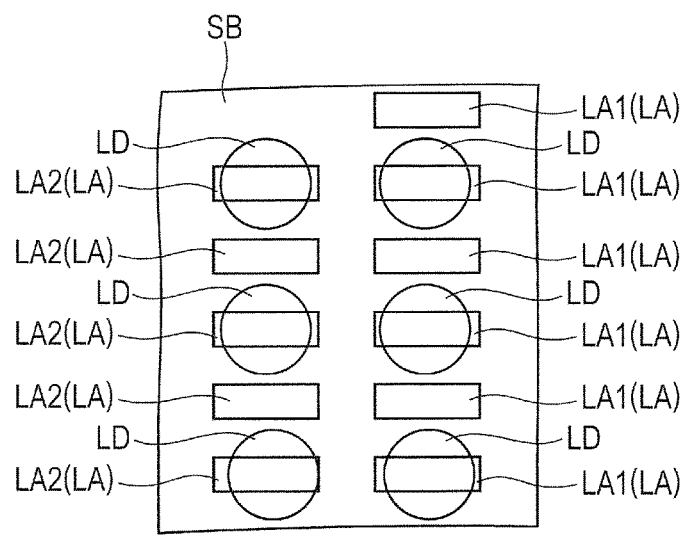

FIG. 11 is a partial plan view for showing the leads of the chip loading surface of the wiring substrate and the lands of the mounting surface of the wiring substrate while being overlapped with each other.

Figure 6:
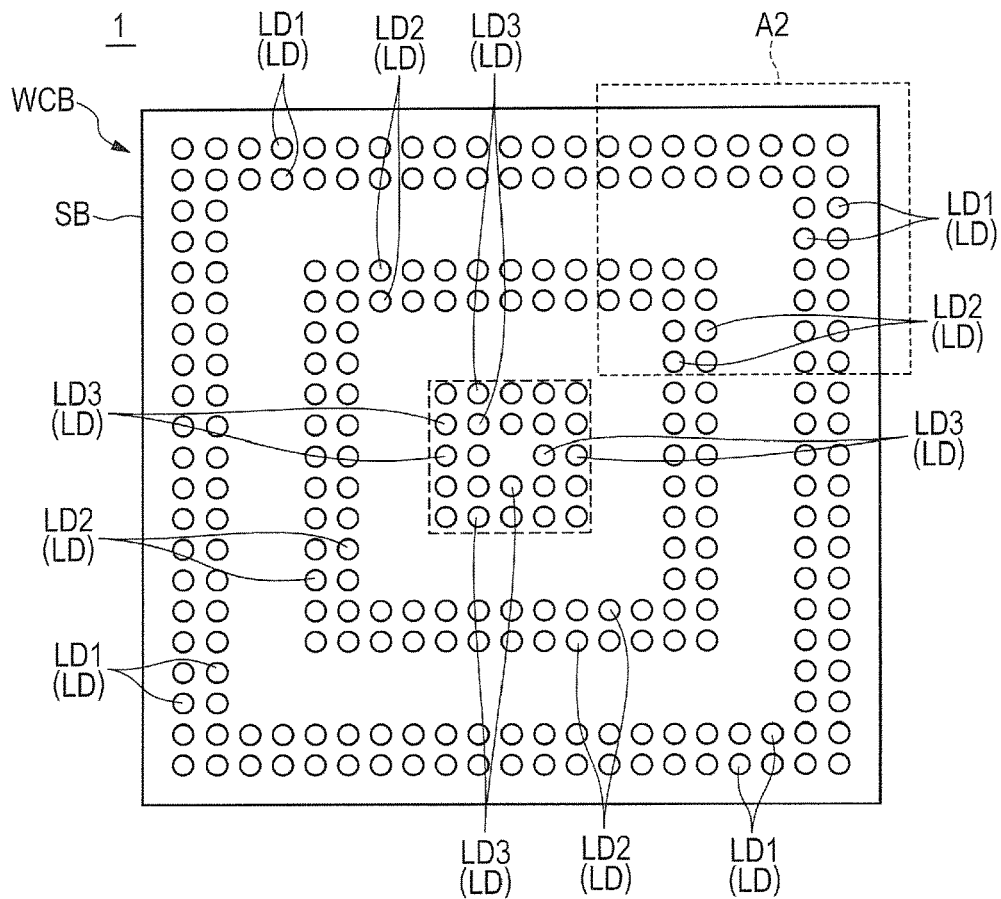
FIG. 6 is a plan view shown by removing solder balls of the mounting surface of the semiconductor device of FIG. 1.
Figure 12:
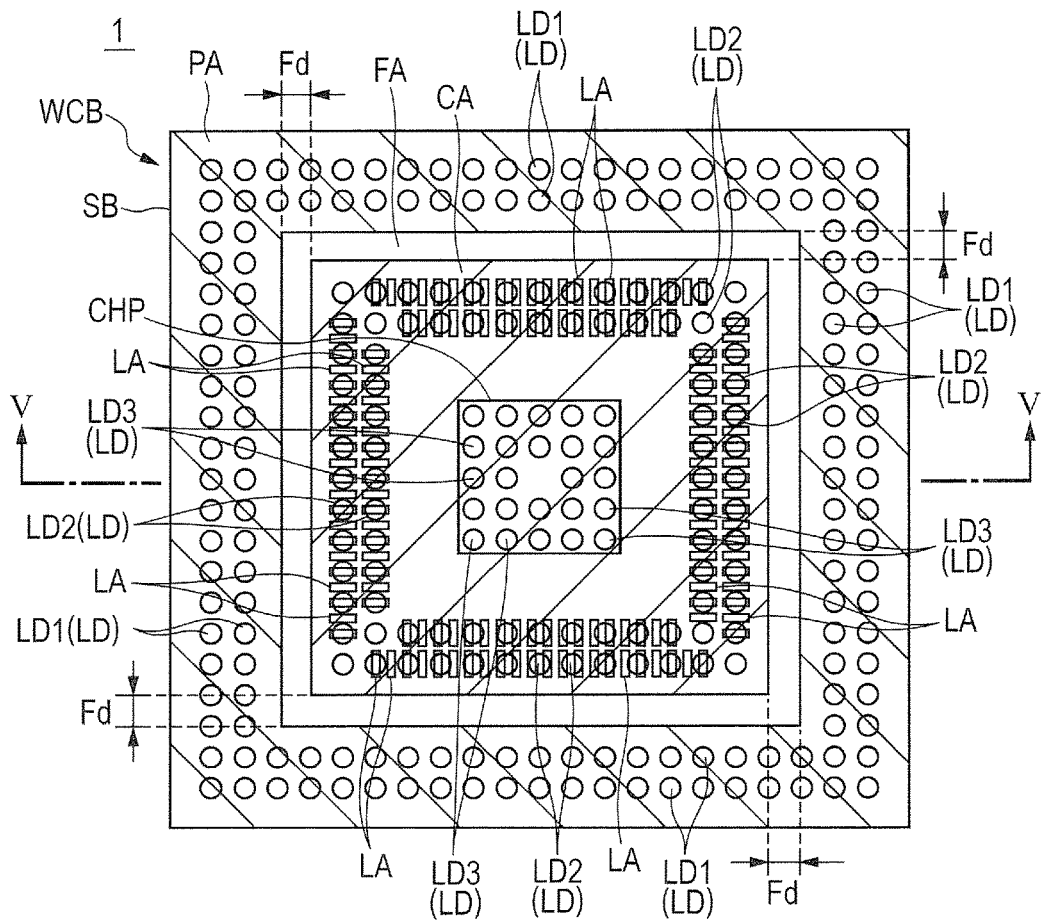

FIG. 12 is a plan view for showing a peripheral area and a central area of the mounting surface of the semiconductor device of FIG. 6.

Figure 13:
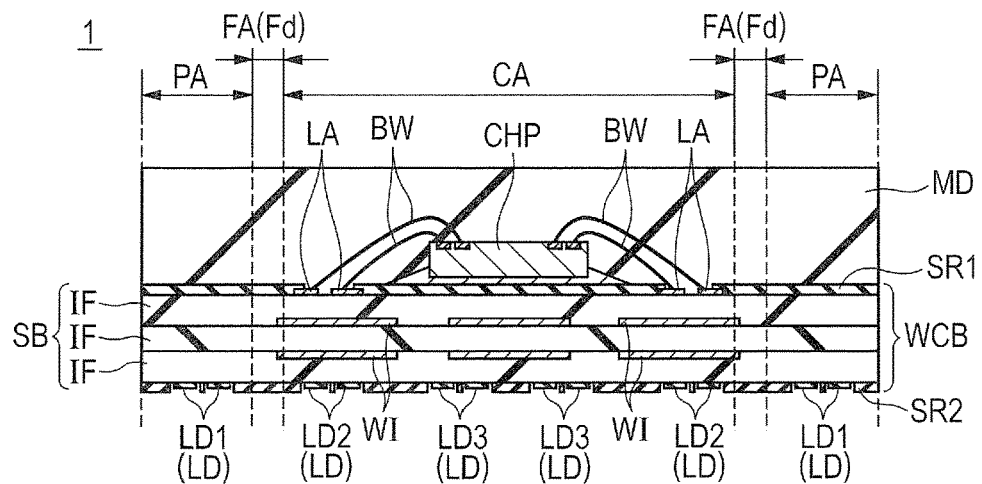

FIG. 13 is a cross-sectional view taken along the line V-V of FIG. 12.

Figure 14:
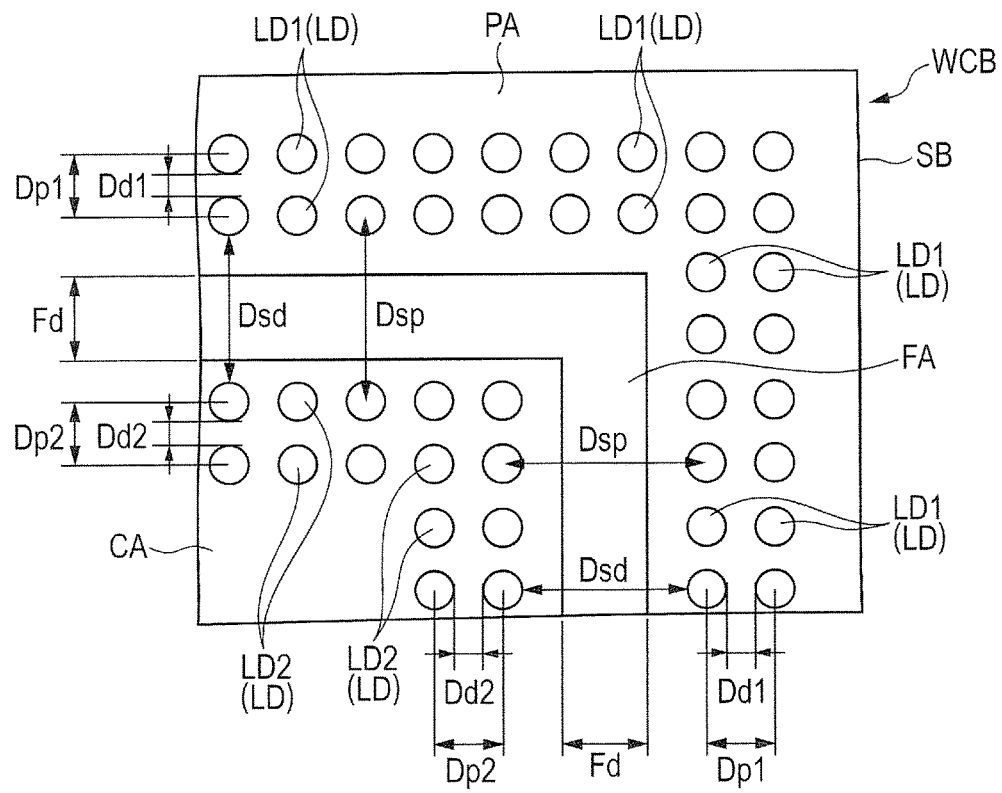

FIG. 14 is an enlarged plan view of main parts on the mounting surface of the wiring substrate of the semiconductor device of FIG. 12.

Figure 15:
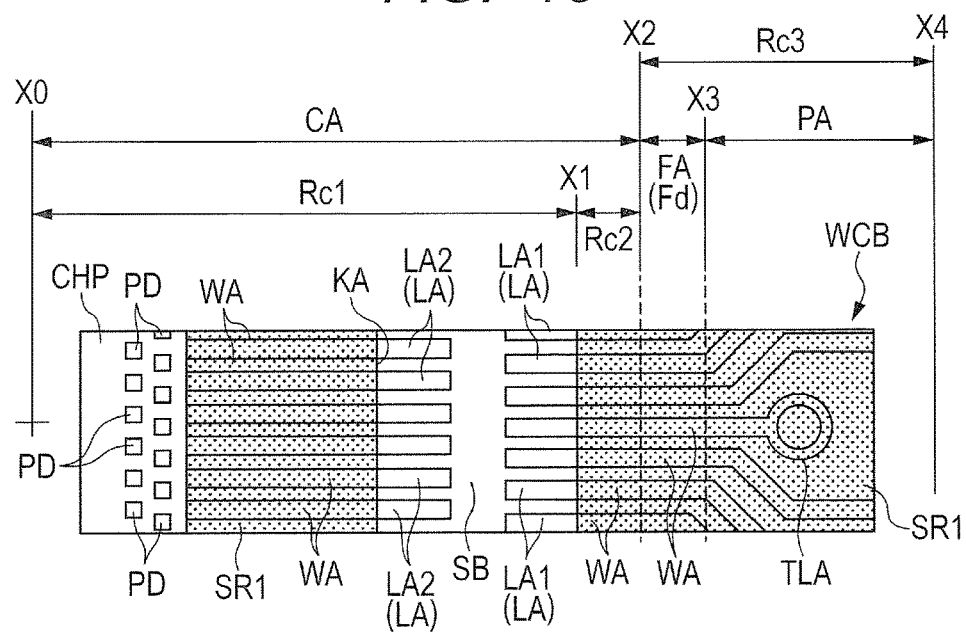

FIG. 15 is an enlarged plan view of main parts on the chip loading surface of the wiring substrate of the semiconductor device of FIG. 12.

Figure 1:
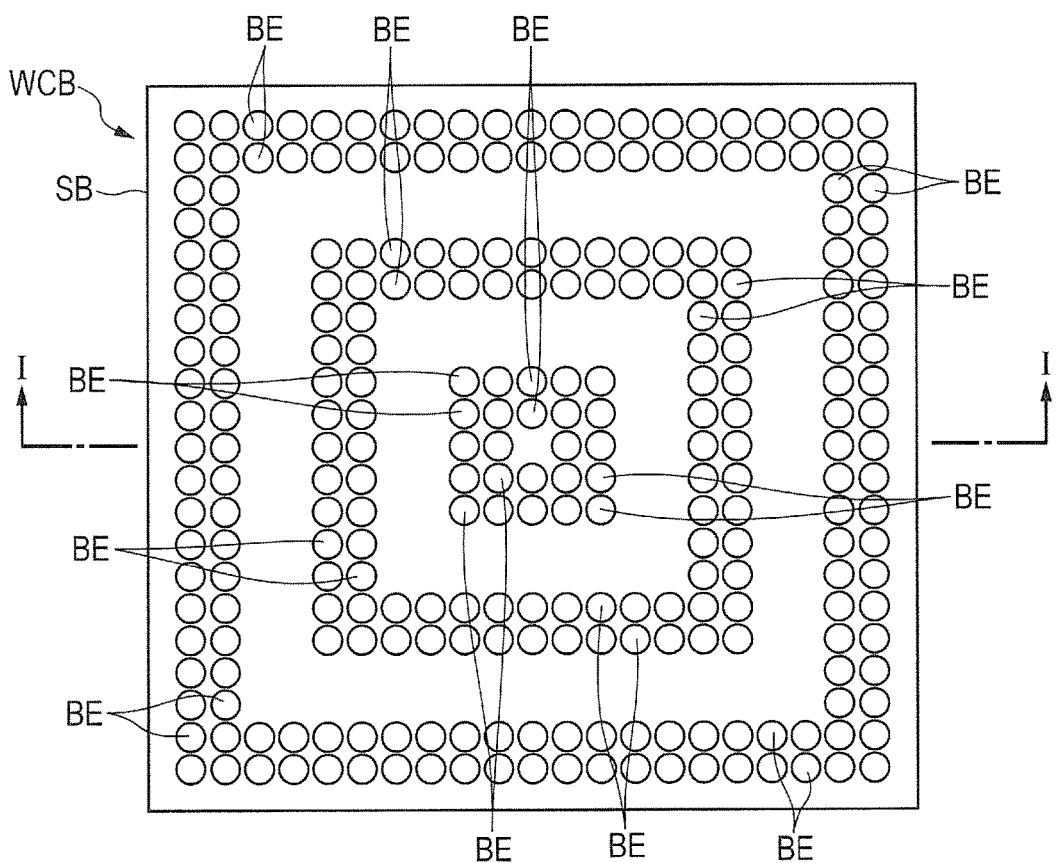
FIG. 1 is a plan view of amounting surface of a semiconductor device of a first embodiment.
Figure 16:
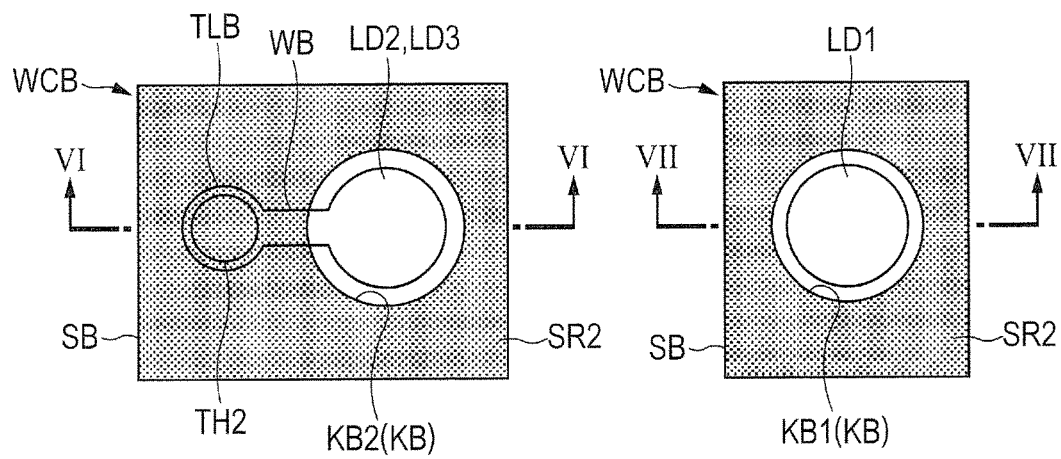

The left side of FIG. 16 is a plan view of main parts of the lands arranged in the central area of the mounting surface of the semiconductor device of FIG. 1, and the right side of FIG. 16 is a plan view of main parts of the land arranged in the peripheral area of the mounting surface of the semiconductor device of FIG. 1.

Figure 17:
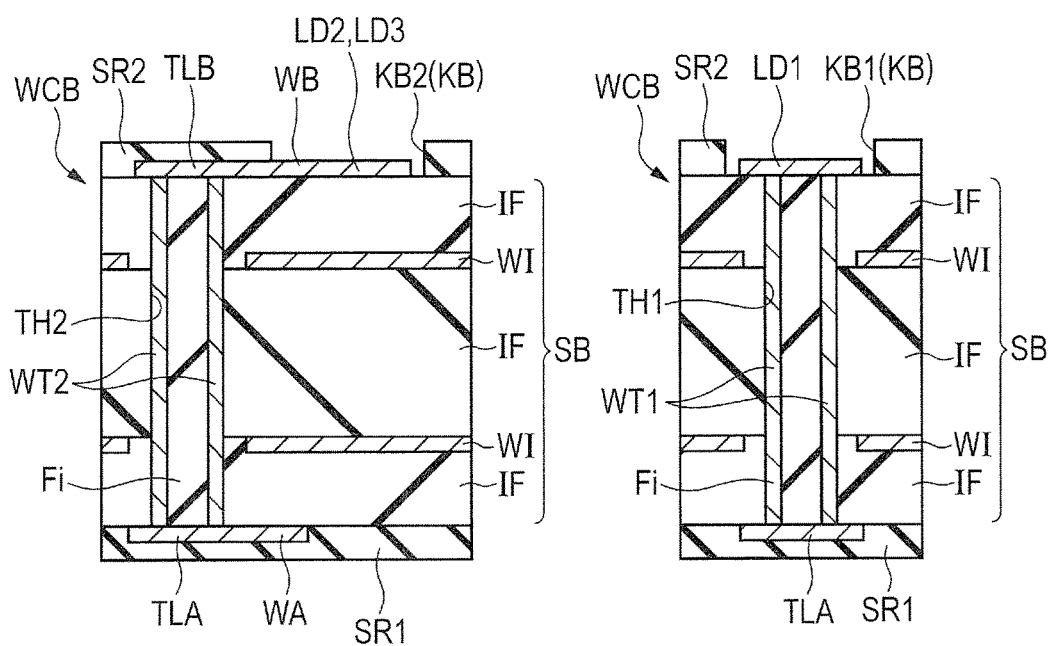

The left side of FIG. 17 is a cross-sectional view taken along the line VI-VI on the left side of FIG. 16, and the right side of FIG. 17 is a cross-sectional view taken along the line VII-VII on the right side of FIG. 16.

Figure 18:
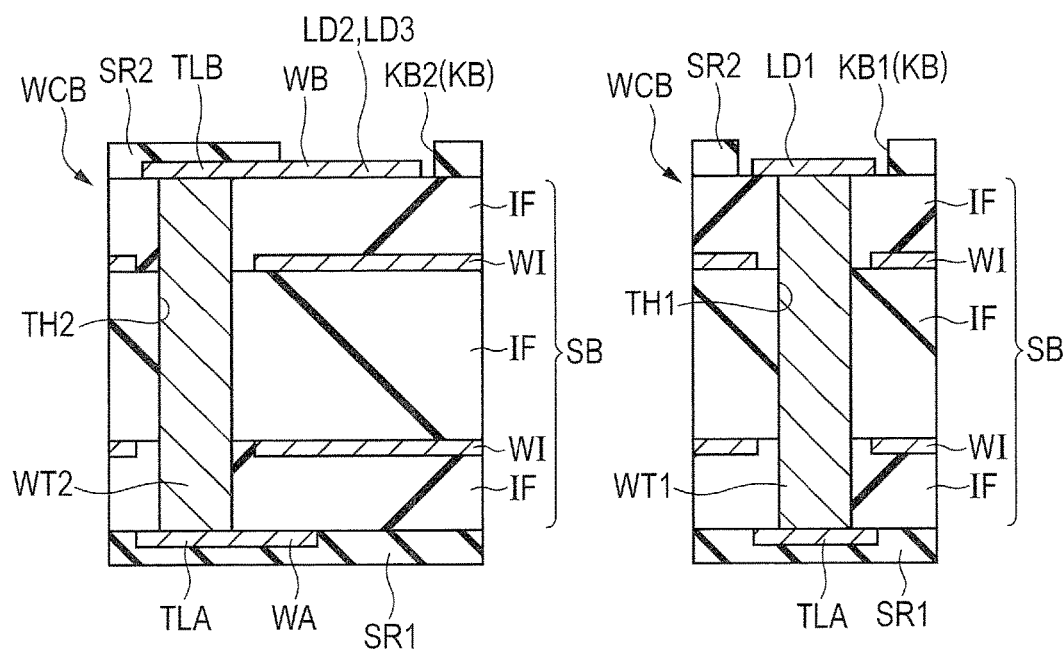

The left side of FIG. 18 shows a modified example of a through-hole wiring and is a cross-sectional view of a part corresponding to the line VI-VI on the left side of FIG. 16, and the right side of FIG. 18 shows a modified example of the through-hole wiring and is a cross-sectional view of a part corresponding to the line VII-VII on the right side of FIG. 16.

Figure 19:
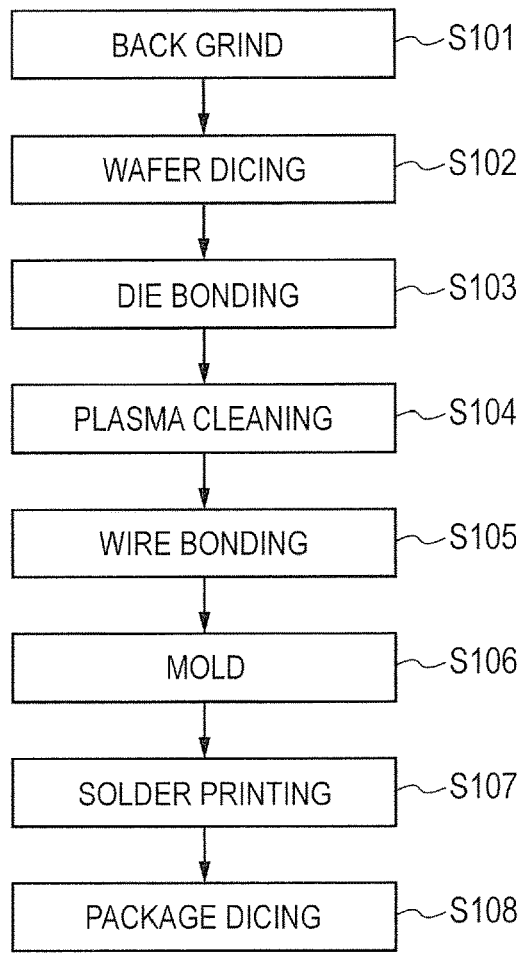

FIG. 19 is a process diagram for showing a manufacturing process of the semiconductor device of FIG. 1.

Figure 20:
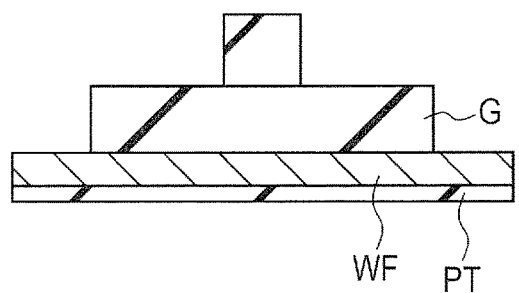

FIG. 20 is a cross-sectional view of a wafer during a back grind process in the manufacturing process of the semiconductor device of FIG. 1.

Figure 21:
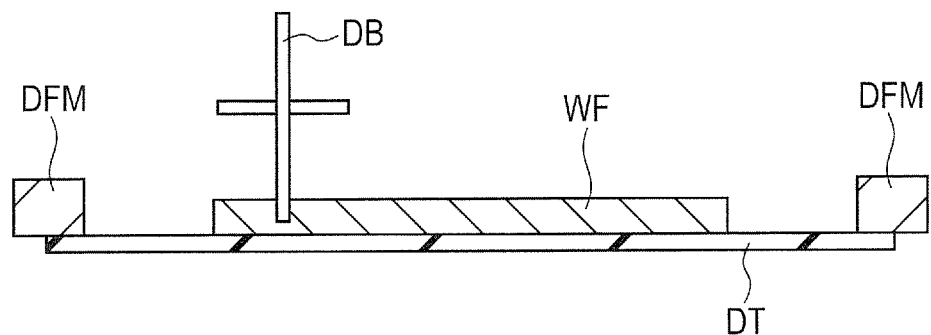

FIG. 21 is a cross-sectional view of the wafer during a dicing process after the process of FIG. 20.

Figure 22:
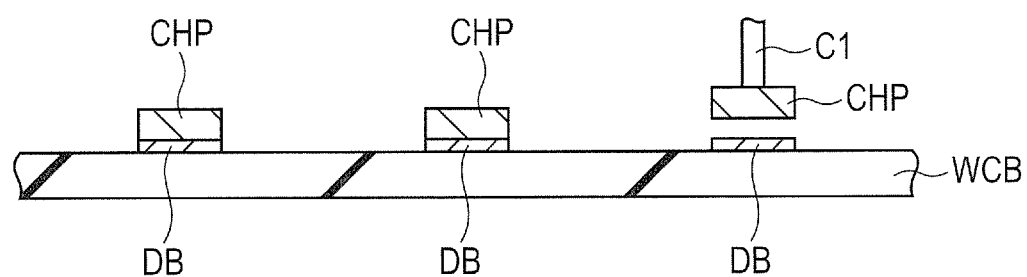

FIG. 22 is a cross-sectional view of the chip and the wiring substrate during a die bonding process after the process of FIG. 21.

Figure 23:
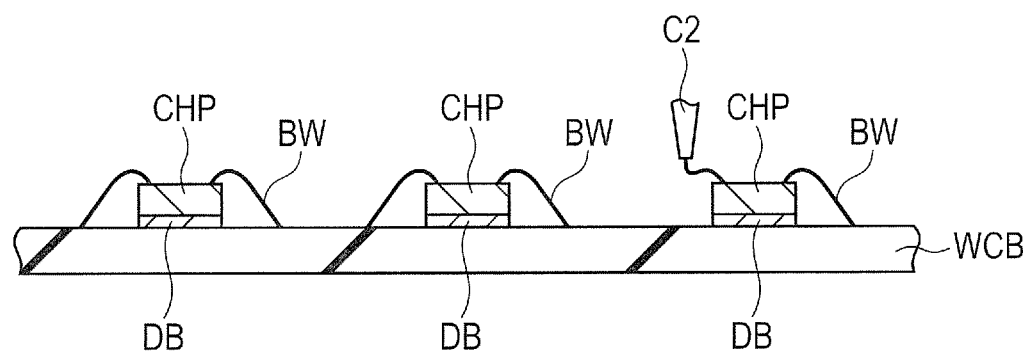

FIG. 23 is a cross-sectional view of the chip and the wiring substrate during a wire bonding process after the process of FIG. 22.

Figure 24:
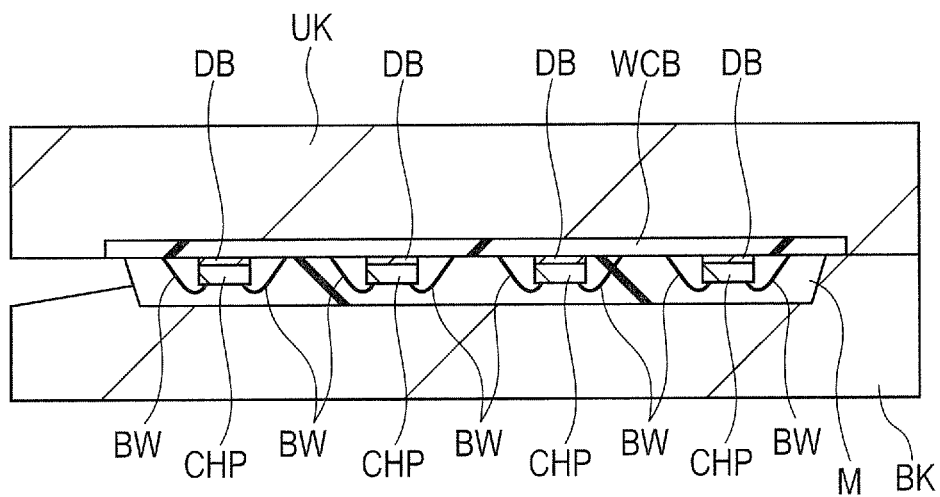

FIG. 24 is a cross-sectional view of the semiconductor device during a collective molding process after the process of FIG. 23.

Figure 25:
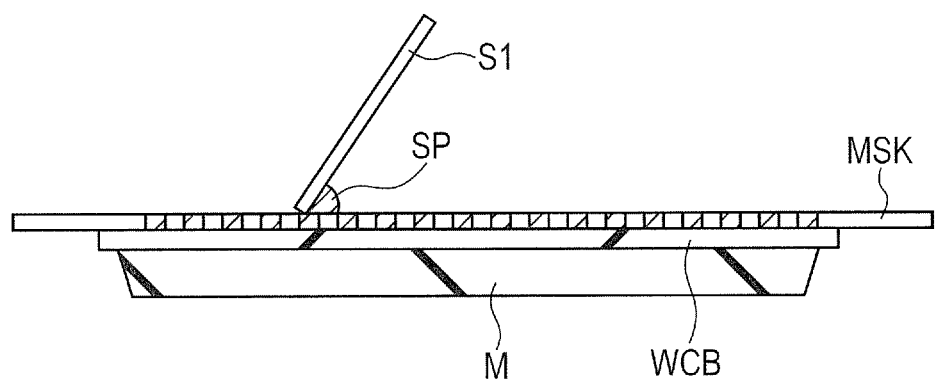

FIG. 25 is a cross-sectional view of the semiconductor device during a solder printing process after the process of FIG. 24.

Figure 26:
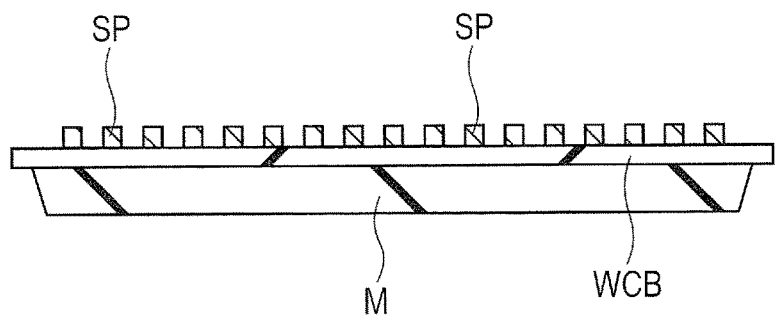

FIG. 26 is a cross-sectional view of the semiconductor device after the process of FIG. 25.

Figure 27:
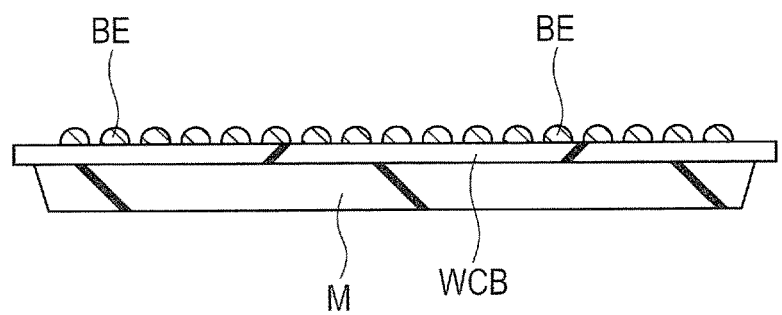

FIG. 27 is a cross-sectional view of the semiconductor device after a reflow process after the process of FIG. 26.

Figure 28:
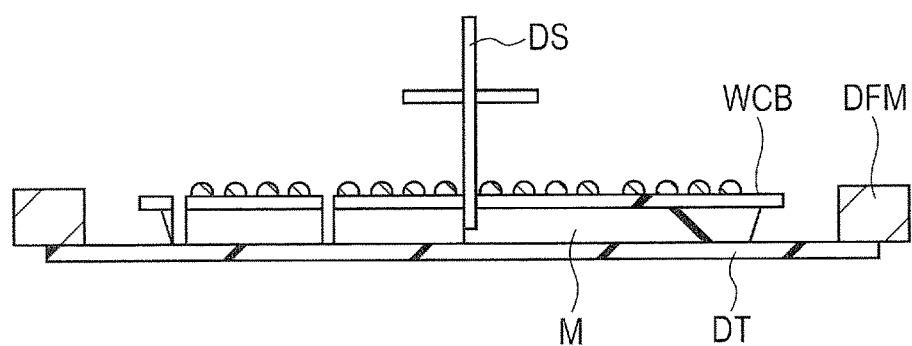

FIG. 28 is a cross-sectional view of the semiconductor device during a package dicing process after the process of FIG. 27.

Figure 29:
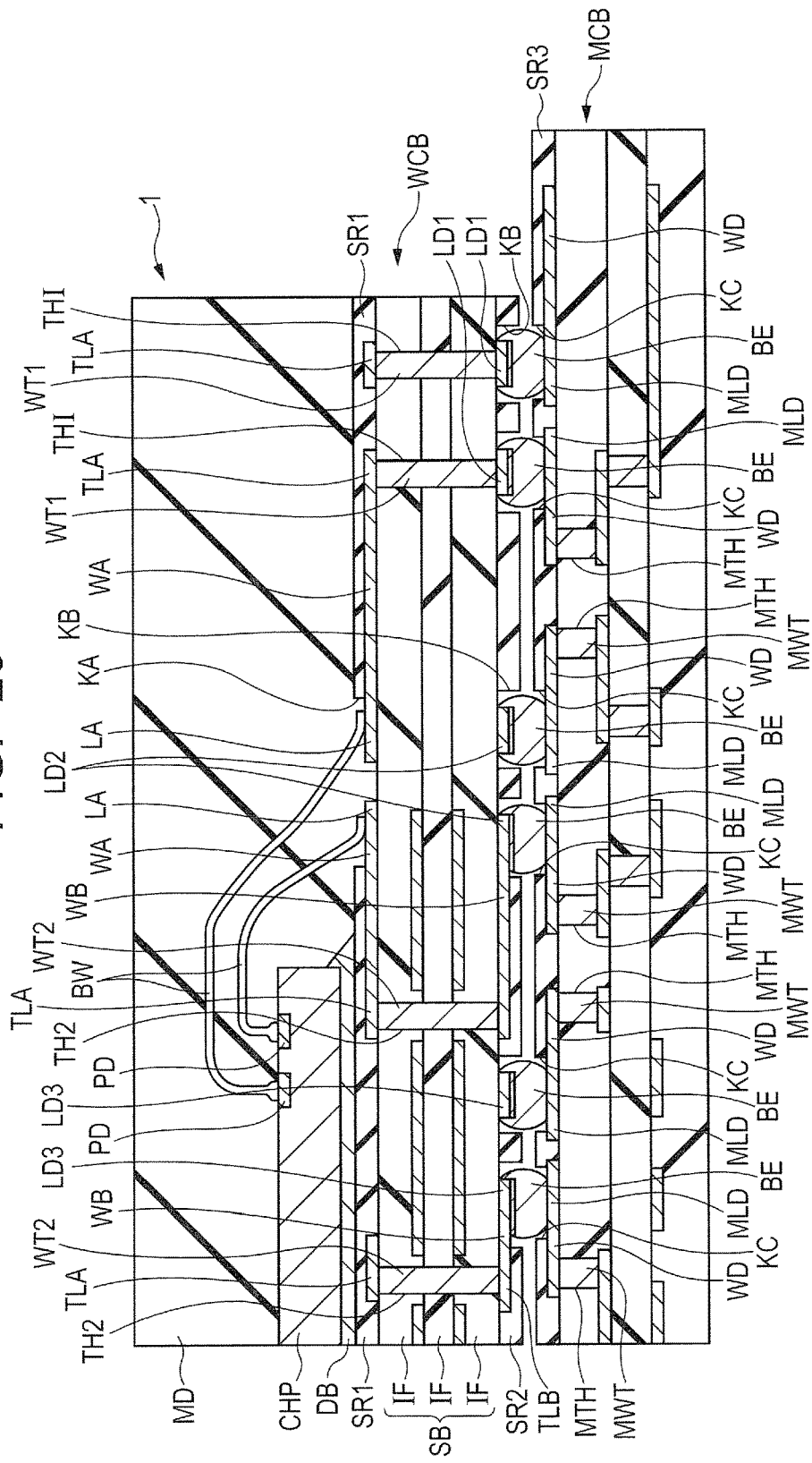

FIG. 29 is a cross-sectional view of main parts of the semiconductor device of FIG. 1 and a mother board on which the semiconductor device is mounted.

Figure 30:
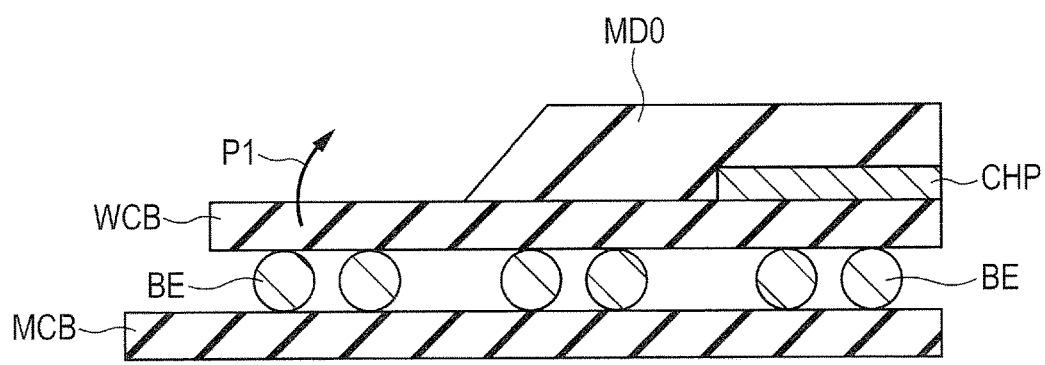

FIG. 30 is a cross-sectional view of main parts of an example of the semiconductor device manufactured by an individual mold method and the mother board on which the semiconductor device is mounted.

Figure 31:
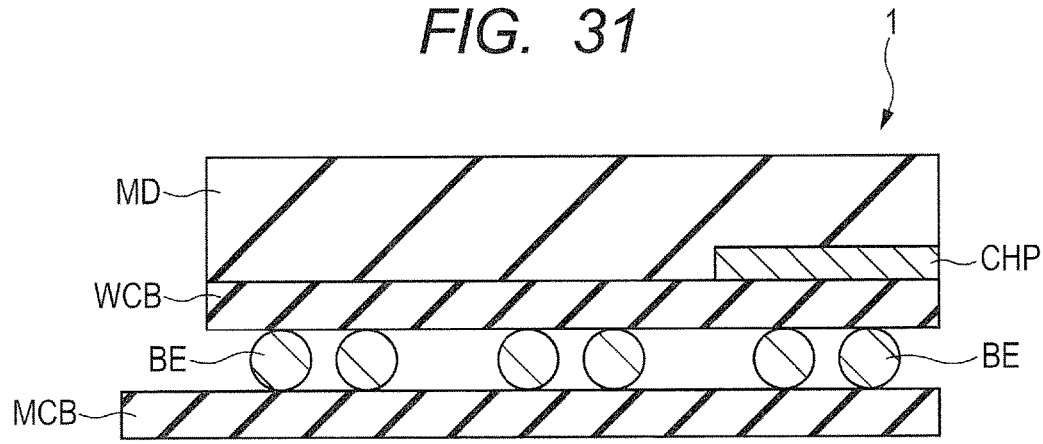

FIG. 31 is a cross-sectional view of main parts of the semiconductor device of FIG. 1 and the mother board on which the semiconductor device is mounted.

Figure 32:
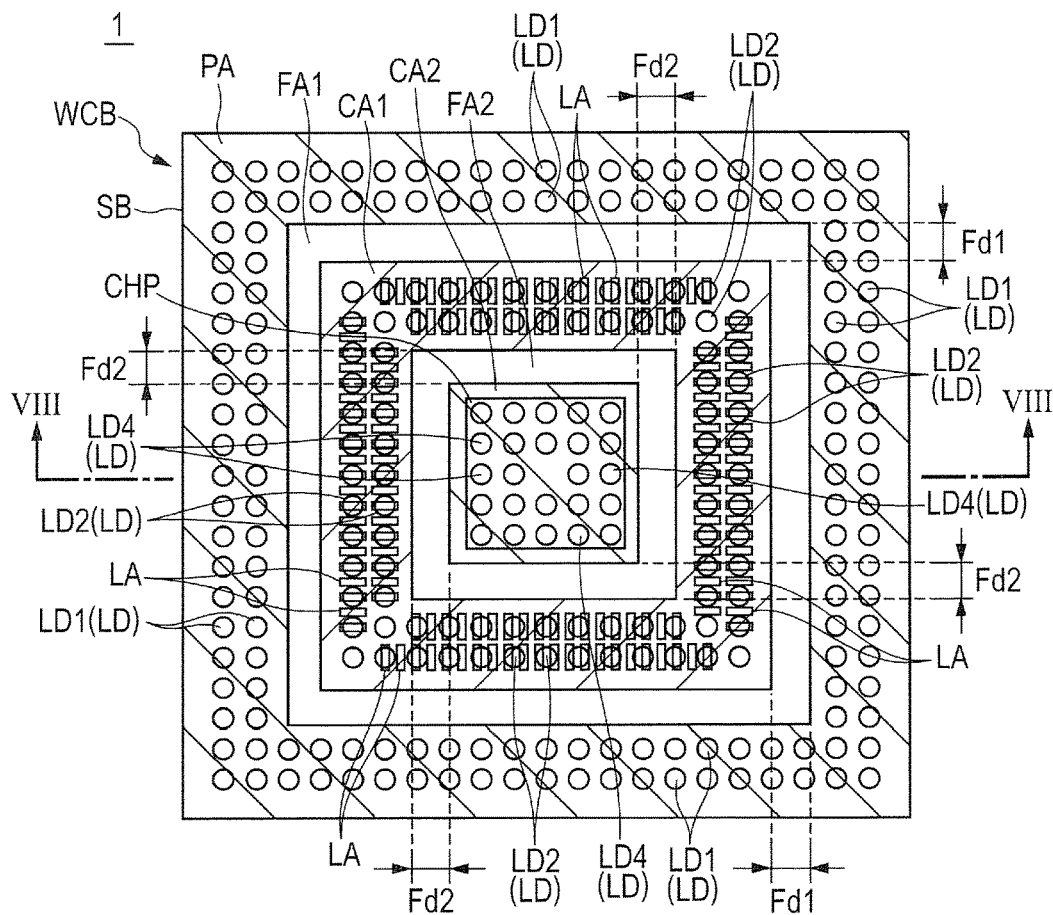

FIG. 32 is a plan view for showing a peripheral area, a first central area, and a second central area on the mounting surface of the semiconductor device of FIG. 6.

Figure 33:
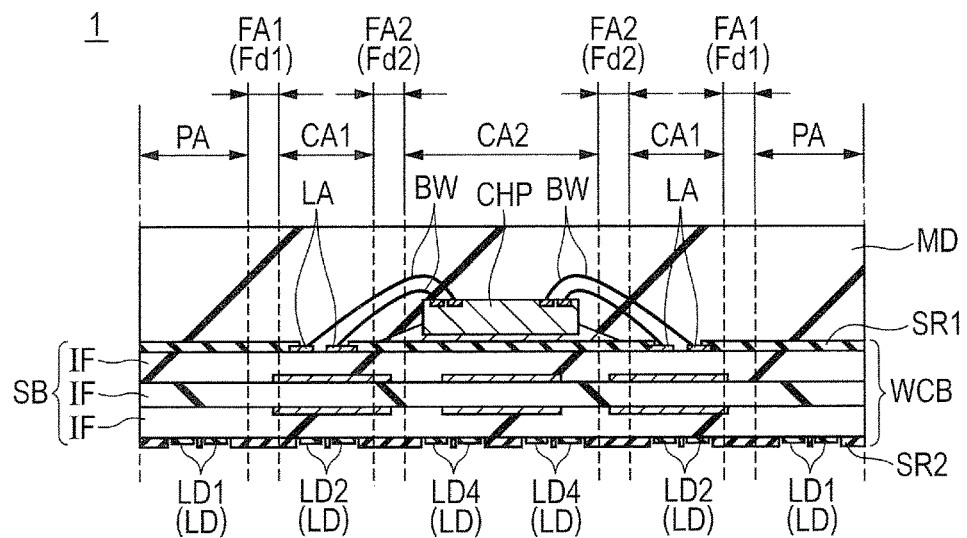

FIG. 33 is a cross-sectional view taken along the line VIII-VIII of FIG. 32.

Figure 34:
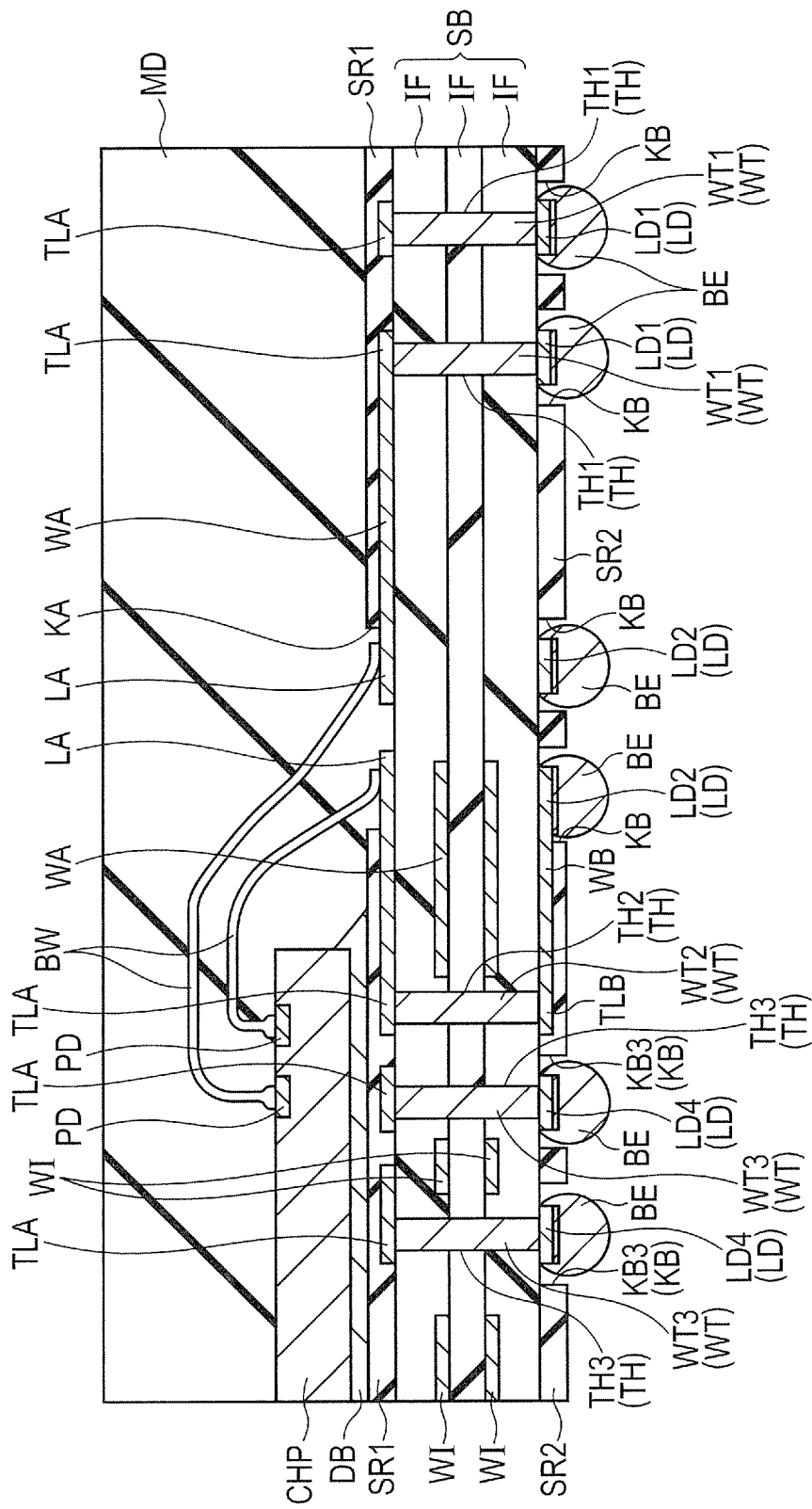

FIG. 34 is an enlarged cross-sectional view of main parts of the semiconductor device of FIG. 33.

Figure 35:
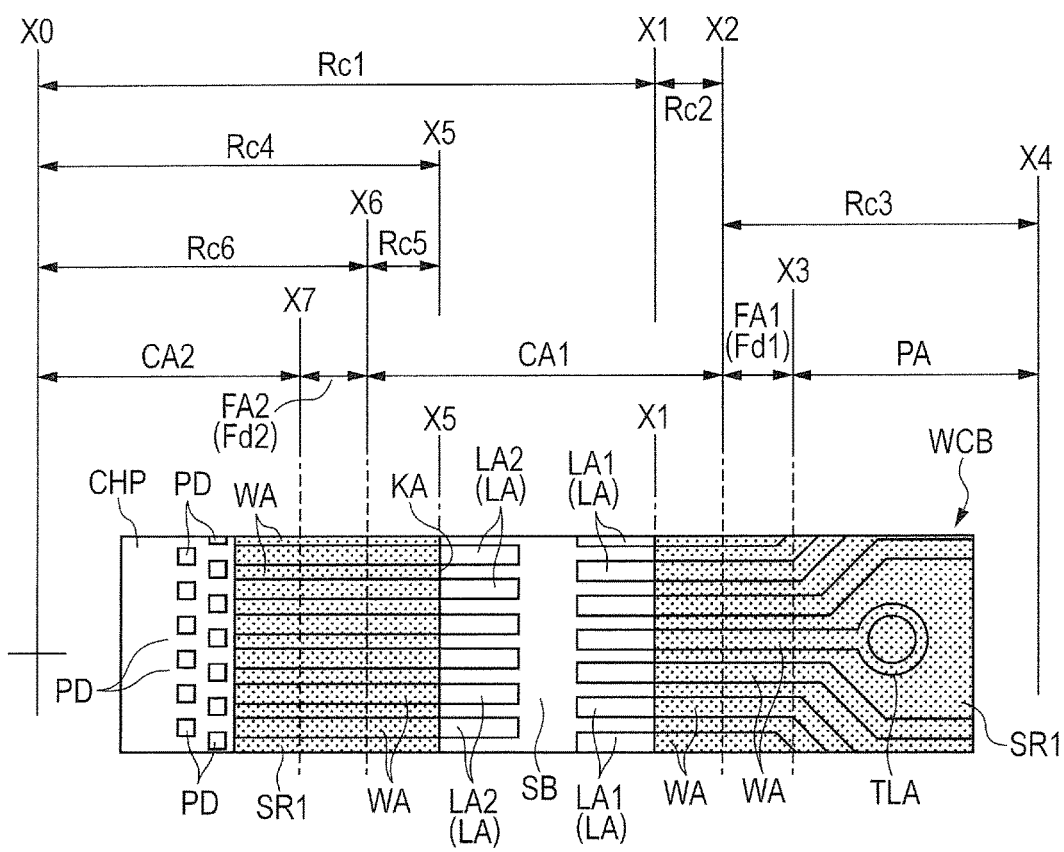

FIG. 35 is an enlarged plan view of main parts of the chip loading surface of the wiring substrate of the semiconductor device of FIG. 32.

DETAILED DESCRIPTION

The present invention will be described using the following embodiments while being divided into a plurality of sections or embodiments if necessary for convenience sake. However, except for a case especially specified, the sections or embodiments are not irrelevant to each other, and one has a relationship as a part or all of a modified example, details, or a supplementary explanation of the other.

Further, when the specification refers to the number of elements (including the number of pieces, values, amounts, ranges, and the like) in the following embodiments, the number is not limited to the specific number, but may be smaller or larger than the specific number, except for a case especially specified or a case obviously limited to the specific number in principle.

Furthermore, it is obvious that the constitutional elements (including elemental steps and the like) are not necessarily essential in the following embodiments except for a case especially specified or a case obviously deemed to be essential in principle.

Likewise, when the specification refers to the shapes or positional relationships of the constitutional elements in the following embodiments, the present invention includes the constitutional elements that are substantially close or similar in shapes and the like, except for a case especially specified or a case obviously deemed not to be close or similar in principle. The same applies to the number and range.

Further, the same members are followed by the same signs in principle in all the drawings for explaining the embodiments, and the repeated explanation thereof will be omitted. It should be noted that hatchings will be added in some cases even in the case of a plan view in order to easily view the drawing.

First Embodiment

<Semiconductor Device>

Figure 2:
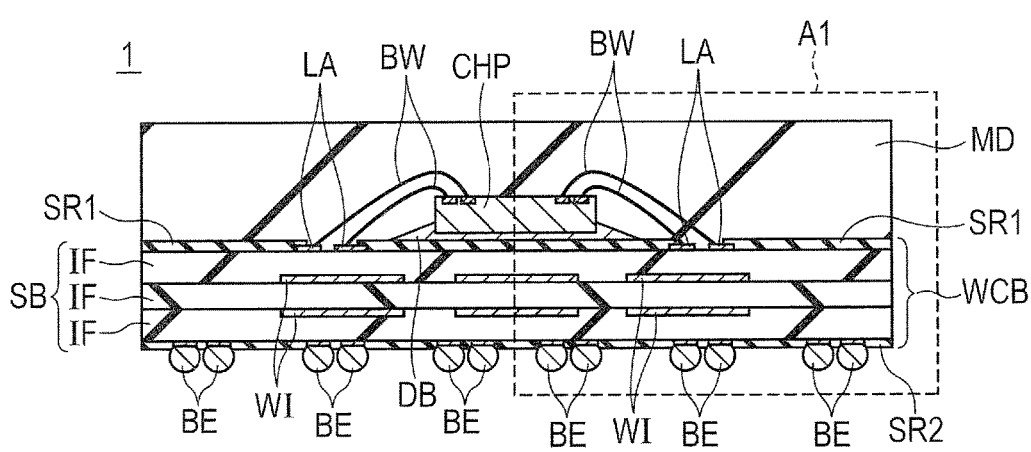
FIG. 2 is a cross-sectional view taken along the line I-I of FIG. 1.
Figure 3:
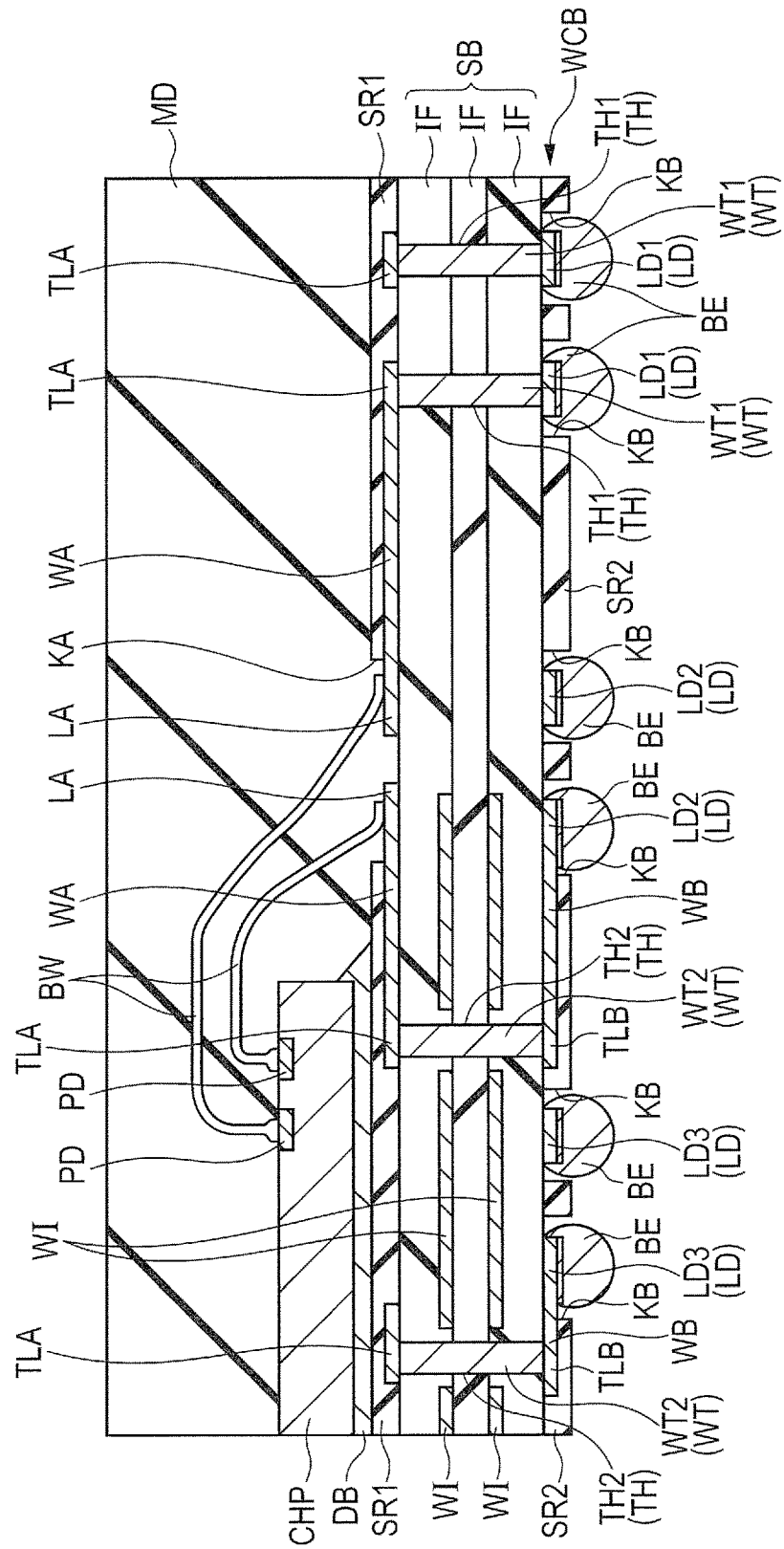
FIG. 3 is an enlarged cross-sectional view of an area A1 surrounded with a broken line of FIG. 2.
Figure 4:
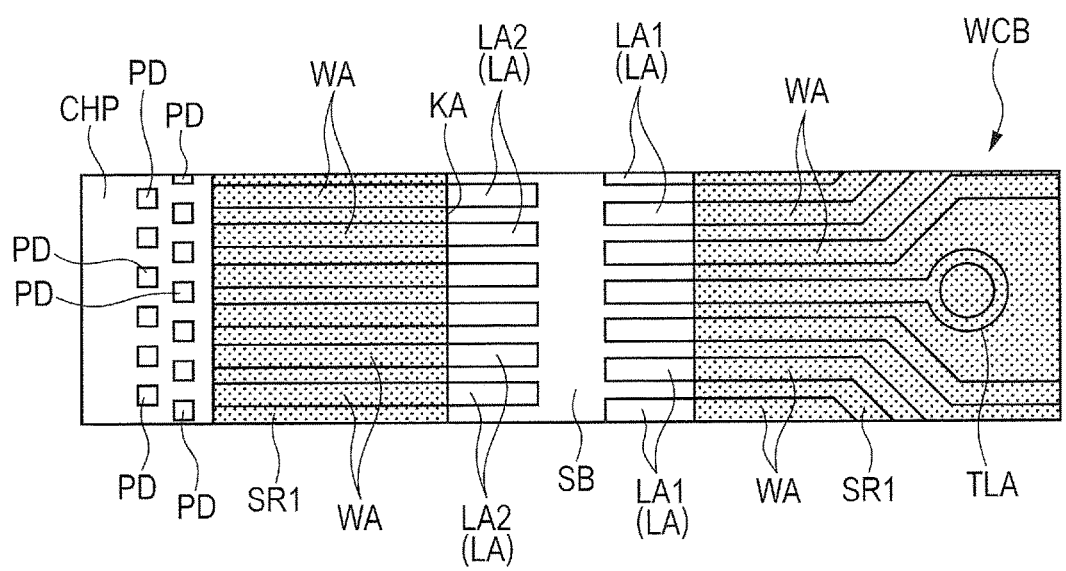
FIG. 4 is an enlarged plan view of main parts of a chip loading surface of a wiring substrate configuring the semiconductor device of FIG. 1.
Figure 5:
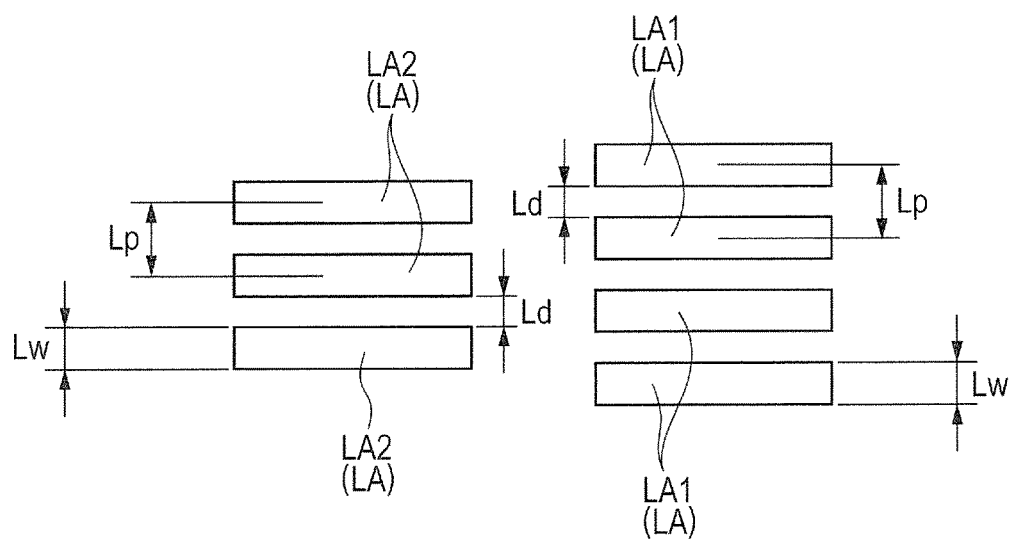
FIG. 5 is an enlarged plan view of a plurality of leads arranged on the chip loading surface of FIG. 4.
Figure 7:
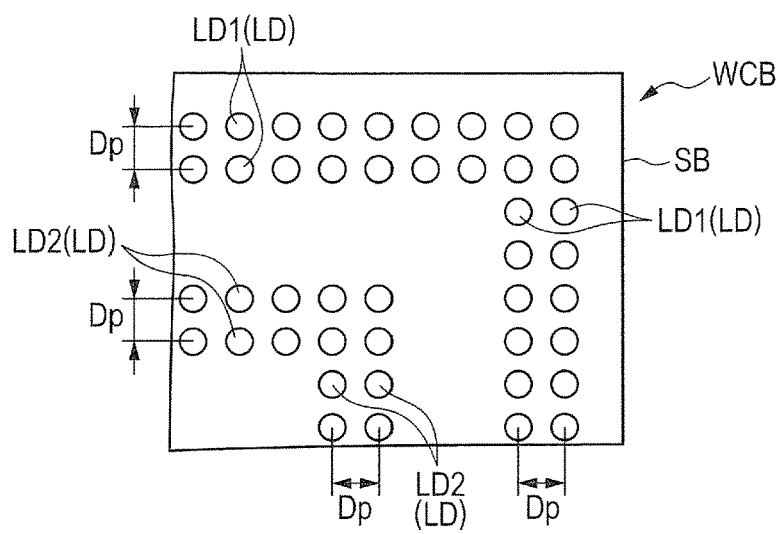
FIG. 7 is an enlarged plan view of an area A2 surrounded with a broken line of FIG. 6.

FIG. 1 is a plan view of a mounting surface of a semiconductor device of the first embodiment, FIG. 2 is a cross-sectional view taken along the line I-I of FIG. 1, and FIG. 3 is an enlarged cross-sectional view of an area A1 surrounded with a broken line of FIG. 2. In addition, FIG. 4 is an enlarged plan view of main parts of a chip loading surface of a wiring substrate configuring the semiconductor device of FIG. 1, and FIG. 5 is an enlarged plan view of a plurality of leads arranged on the chip loading surface of FIG. 4. Further, FIG. 6 is a plan view shown by removing solder balls of the mounting surface of the semiconductor device of FIG. 1, and FIG. 7 is an enlarged plan view of an area A2 surrounded with a broken line of FIG. 6.

A semiconductor device 1 of the first embodiment is a semiconductor device of a BGA (Ball Grid Array) package structure formed by, for example, a MAP (Mold Array Package) method, and includes a wiring substrate WCB and a semiconductor chip (hereinafter, simply referred to as a chip) CHP mounted on a chip mounting area that is located nearly at the center of a chip loading surface of the wiring substrate WCB.

The wiring substrate WCB is a structure in which wirings for extracting an electrode of an integrated circuit of a chip CHP to the outside are formed. For example, the wiring substrate WCB is formed in a quadrangular shape in plan view, and the external dimension thereof is set to be, for example, 20×20 mm or larger, specifically, 25×25 mm.

A substrate SB configuring the wiring substrate WCB is formed by using, for example, an insulating thin plate formed in a quadrangular shape in plan view, and has a chip loading surface (first surface), a mounting surface (second surface) on the opposite side, and a plurality of insulating layers IF laminated therebetween. Each insulating layer IF is formed of, for example, epoxy resin. It should be noted that the quadrangular shape of the wiring substrate WCB (or the substrate SB) includes a polygonal shape or a quadrangular shape with rounded corners by forming a taper or the like at each corner of the wiring substrate WCB (or the substrate SB).

As shown in FIGS. 3 and 4, a plurality of leads (bonding fingers and bonding leads) LA, a plurality of through-hole lands TLA, and a plurality of wiring parts WA through which these are electrically connected with each other are arranged on the chip loading surface of the substrate SB. The leads LA, the through-hole lands TLA, and the wiring parts WA are integrally formed by using, for example, metal such as copper (Cu) or the like.

The leads LA are arranged side by side along the outer periphery of the chip CHP so as to surround the chip CHP. Here, as shown in FIG. 4, the leads LA are arranged along the outer periphery (four sides) of the chip CHP in a state where, for example, two rows of leads are arranged. The two rows of leads LA (LA1 and LA2) are arranged in a zigzag manner while being separated from each other. That is, the two rows of leads LA (LA1 and LA2) are arranged in a state where the positions thereof are shifted along the outer periphery of the chip CHP. As shown in FIG. 5, the width Lw of each lead LA is, for example, about 85 µm. The minimum distance Ld between the leads LA is, for example, about 50 µm. The minimum pitch Lp of the lead LA is, for example, about 370 µm.

As shown in FIG. 4, the through-hole land TLA is formed in a substantially circular pattern in plan view while having a width wider than each of the leads LA and the wiring parts WA. The diameter of the through-hole land TLA is, for example, about 300 µm, and the minimum pitch of the through-hole land TLA is, for example, about 370 µm.

Further, a solder resist (first insulating film) SR1 is formed on the chip loading surface of the substrate SB so as to cover the through-hole lands TLA and the wiring parts WA. The solder resist SR1 is formed of, for example, mixed resin of epoxy resin and acrylic resin. As shown in FIG. 4, an opening portion KA from which some of the wiring parts WA are exposed is formed at a part of the solder resist SR1. Some of the wiring parts WA exposed from the opening portion KA are the leads LA. It should be noted that the solder resist SR1 is hatched in FIG. 4 in order to easily view the drawing.

Further, as shown in FIGS. 2 and 3, the chip CHP is mounted on the chip loading surface of the substrate SB (wiring substrate WCB) through a die bond material DB and the solder resist SR1 in a state where the main surface (third surface) of the chip CHP faces upwards and the back surface (fourth surface) of the chip CHP faces the chip loading surface of the substrate SB. It should be noted that the die bond material DB is formed of, for example, a paste material, a film material, or the like.

For example, the chip CHP is formed in a quadrangular shape in plan view, and the external dimension thereof is set to be, for example, about 7×7 mm. As shown in FIG. 4, a plurality of pads (electrodes) PD is arranged side by side along the outer periphery (four sides) of the chip CHP in the vicinity of the outer periphery (four sides) of the main surface of the chip CHP. The pads PD are electrically connected with the integrated circuit of the chip CHP, and are electrically connected with the leads LA of the wiring substrate WCB through bonding wires (hereinafter, simply referred to as wires) BW as shown in FIG. 3.

Further, as shown in FIG. 3, a resin sealing body MD is formed on the chip loading surface of the substrate SB so as to cover the chip CHP, the wires BW, the leads LA, and the solder resists SR1. The resin sealing body MD is formed of, for example, thermosetting epoxy resin. The side surfaces of the resin sealing body MD coincide with the side surfaces of the wiring substrate WCB, and are formed nearly perpendicular to the chip loading surface of the wiring substrate WCB.

On the other hand, as shown in FIGS. 3 and 6, a plurality of lands (bump lands, pads, and terminals) LD (LD1, LD2, and LD3), a plurality of through-hole lands TLB, and the wiring parts WB are arranged on the mounting surface of the substrate SB. The lands LD (LD1, LD2, and LD3), the through-hole lands TLB, and the wiring parts WB are formed of, for example, metal such as copper (Cu) or the like.

The lands (first lands) LD1 are arranged along the outer periphery (four sides: edge) of the substrate SB in a state where, for example, two rows of lands LD1 are arranged. Further, the inner lands (second lands) LD2 and LD3 surrounded by the group of lands LD1 are also arranged along the outer periphery (four sides: edge) of the substrate SB in a state where two rows of lands LD2 and two rows of lands LD3 are arranged. A distance (shortest distance) between the group of lands LD1 and the group of lands LD2 and a distance (shortest distance) between the group of lands LD2 and the group of lands LD3 are set to be equal to or larger than one row (corresponding to one land LD) of lands LD. Accordingly, it is possible to easily route the wires on the mother board side on which the semiconductor device 1 is mounted.

Each of the lands LD (LD1 to LD3) is formed in, for example, a circular shape in plan view, and the diameter thereof is, for example, about 400 μm. Further, as shown in FIG. 7, the pitch Dp between the adjacent lands LD (LD1 to LD3) is, for example, about 800 μm.

Further, as shown in FIGS. 2 and 3, solder balls (solder bumps, external terminals, and projecting electrodes) BE are bonded to the respective lands LD (LD1 to LD3). The solder ball BE is formed of, for example, a lead-free alloy such as a tin (Sn)—silver (Ag)—copper (Cu) alloy or the like.

As shown in FIG. 3, the through-hole land TLB is arranged in the chip loading area. The through-hole land TLB is formed in a substantially circular pattern having a width larger than that of the wiring part WB and a diameter smaller than that of the land LD (LD1 to LD3). The diameter of the through-hole land TLB is, for example, about 300 μm, and the minimum pitch between the adjacent through-hole lands TLB is, for example, about 370 μm.

The wiring part WB is a lead-out wiring part that electrically connects each of the lands LD2 and LD3 to the through-hole land TLB, and is integrally formed with the lands LD2 and the LD3 and the through-hole land TLB. The width of the wiring part WB is, for example, about 300 μm.

Further, a solder resist (second insulating film) SR2 is formed on the mounting surface of the substrate SB so as to cover a part of the wiring part WB and the through-hole land TLB. The solder resist SR2 is formed of, for example, mixed resin of epoxy resin and acrylic resin. A plurality of opening portions KB for exposing the lands LD (LD1 to LD3) and a part of the wiring part WB is formed in a part of the solder resist SR2.

The opening portion KB is formed in a circular shape having a diameter larger than that of the land LD (LD1 to LD3) in plan view, and is arranged so as to include the entirety of each land LD (LD1 to LD3). That is, all the lands LD of the mounting surface of the semiconductor device 1 in the embodiment are lands LD having an NSMD (Non Solder Mask Defined) structure. The diameter of the opening portion KB is, for example, about 520 μm. The land structure will be described later.

Further, as shown in FIGS. 2 and 3, a plurality of wiring layers is formed between the chip loading surface and the mounting surface of the substrate SB, and an inner-layer wiring WI is formed in each of the wiring layers. The inner-layer wiring WI is formed of, for example, metal such as copper (Cu) or the like. The number of wiring layers is, for example, 2, 4, or more. It should be noted that the substrate SB corresponds to a core material in the case of a two-layer substrate having two wiring layers, and corresponds to the assembly of all the insulating layers IF sandwiched between the solder resists SR1 and SR2 in the case of a multilayer substrate having four or more wiring layers. That is, the "substrate" mentioned here is configured using the insulating layers IF.

Further, as shown in FIG. 3, a plurality of through-holes TH (TH1 and TH2) penetrating the chip loading surface and the mounting surface located on the back side thereof is formed in the substrate SB while being nearly perpendicular to the chip loading surface and the mounting surface. Through-hole wirings WT (WT1 and WT2) are provided inside the through-holes TH (TH1 and TH2), respectively. The diameter of each through-hole TH (TH1 and TH2) is, for example, about 150 μm.

One through-hole (first through-hole) TH1 is arranged at a position overlapping with the through-hole land TLA on the outer peripheral side of the chip loading surface of the substrate SB and the land LD1 on the outer peripheral side of the mounting surface of the substrate SB in plan view. Accordingly, the through-hole land TLA on the outer peripheral side of the chip loading surface of the substrate SB and the land LD1 on the outer peripheral side of the mounting surface of the substrate SB are electrically connected with each other through the through-hole wiring (first through-hole wiring) WT1. That is, the through-hole land TLA on the outer peripheral side of the chip loading surface of the substrate SB is directly and electrically connected with the land LD1 on the outer peripheral side of the mounting surface of the substrate SB through the through-hole wiring WT1.

The other through-hole (second through-hole) TH2 is arranged at a position overlapping with the through-hole land TLA arranged on the central side (in the chip loading area) of the chip loading surface of the substrate SB and the through-hole land TLB arranged on the central side (in the chip loading area) of the mounting surface of the substrate SB in plan view. Accordingly, the through-hole land TLA arranged on the central side (in the chip loading area) of the chip loading surface of the substrate SB and the through-hole land TLB arranged on the central side (in the chip loading area) of the mounting surface of the substrate SB are electrically connected with each other through the through-hole wiring (second through-hole wiring) WT2. That is, the through-hole land TLA of the chip loading surface of the substrate SB is electrically connected with the through-hole land TLB of the mounting surface of the substrate SB through the through-hole wiring WT2, and is further electrically connected with the lands LD2 and LD3 via the wiring part WB formed (connected) integrally with the through-hole land TLB.

Next, problems found by the inventors about the land structure arranged on the mounting surface of the semiconductor device will be described.

The left side of FIG. 8 is a plan view of the land having the SMD structure, and the right side of FIG. 8 is a partial cross-sectional view taken along the line II-II on the left side of FIG. 8. In the case of the SMD (Solder Mask Defined) structure, the diameter of an opening portion KC formed in the solder resist SR2 is smaller than that of the land LD, and the opening portion KC is included in the upper surface (the surface facing the mother board) of the land LD. Therefore, the entire circumference near the outer periphery of the upper surface of the land LD is covered with the solder resist SR2. In this case, the contact surface between the solder ball BE and the land LD is flat (linear), and the bonding area between the solder ball BE and the land LD is smaller than the land LD having the NSMD structure. Therefore, in a test accompanied by heat such as a temperature cycle test or the like, cracks CK are likely to be generated in the solder ball BE near the inner periphery of the opening portion KC of the solder resist SR2. That is, in the case of the SMD structure, there is a problem that the bonding reliability between the solder ball BE and the land LD is deteriorated.

On the other hand, the left side of FIG. 9 is a plan view of the land having the MSMD structure, and the right side of FIG. 9 is a partial cross-sectional view taken along the line on the left side of FIG. 9. In the case of the NSMD structure, the diameter of the opening portion KB formed in the solder resist SR2 is larger than that of the land LD, and the opening portion KB includes the land LD. Therefore, in the case of the NSMD structure, the upper surface of the land LD and the side surface intersecting therewith are exposed from the opening portion KB of the solder resist SR2. Therefore, since the solder ball BE is bonded to the upper surface and the side surface of the land LD, the land LD having the NSMD structure is higher than the land LD having the SMD structure in the bonding reliability between the solder ball BE and the land LD. However, even in the case of the NSMD structure, the wiring part WB extending outward from a part of the outer periphery of the land LD exists, and the outer periphery of the opening portion KB overlaps with the wiring part WB. Therefore, in a test accompanied by heat such as a temperature cycle test or the like, the stress concentrates on the wiring part WB with which the outer periphery of the opening portion KB overlaps, and the cracks CK are generated in the solder ball BE. That is, even in the case of the NSMD structure, there is a problem that the bonding reliability between the solder ball BE and the land LD is deteriorated in the case where the lead-out wiring part is connected. According to the study by the inventors, even in the case of using the land having the NSMD structure, when the lead-out wiring part is connected with the land, the problem that the cracks CK are generated in the solder ball BE on the outer peripheral side of the wiring substrate WCB where the thermal stress is relatively high becomes remarkable, for example, when the external dimension of the wiring substrate WCB is set to be 20×20 mm or larger.

Next, the left side of FIG. 10 is a plan view of the land having the MSMD structure and the land-on-through-hole structure (land-on-via structure), and the right side of FIG. 10 is a partial cross-sectional view taken along the line IV-IV on the left side of FIG. 10. The land of the first embodiment has the land-on-through-hole structure (land-on-via structure) and the NSMD structure. That is, the diameter of the opening portion KB formed in the solder resist SR2 is larger than that of the land LD, and the opening portion KB is arranged while including the land LD. However, in the case of the land-on-through-hole structure, the through-hole TH overlaps with the land LD in plan view, and there is no wiring part connected to the land LD in the same layer as the land LD. Therefore, since the solder ball BE is bonded to the upper surface and the side surface of the entire circumference of the land LD, the bonding strength of the solder ball BE is improved, and cracks are hardly generated in the solder ball BE. Therefore, the land-on-through-hole structure is the most excellent in thermal stress resistance in the above-described land structures.

However, according to the study, the inventors found that when the land-on-through-hole structure was adopted for all the lands LD in the mounting surface of the wiring substrate WCB, it was difficult to route the wirings connecting the leads LA arranged on the chip loading surface of the wiring substrate WCB to the lands LD arranged on the mounting surface of the wiring substrate WCB. FIG. 11 is a partial plan view for showing the leads of the chip loading surface of the wiring substrate and the lands of the mounting surface of the wiring substrate while being overlapped with each other. Since the wires BW (see FIG. 3) are connected with the leads LA, the leads LA are formed in accordance with the dimension (the pitch or the adjacent distance) of the pad PD of the chip CHP. Therefore, the leads LA are densely arranged at narrow adjacent distances. On the other hand, the lands LD cannot be made too small from the viewpoint of securing the bonding reliability with the solder balls BE, and cannot be arranged at narrower distances from the viewpoint of being connected with the lands (the terminals and the electrodes) of the mother board. Thus, if the land LD having the land-on-through-hole structure is arranged in the area (the overlapped area in transparent plan view) where the lead LA is arranged, it is difficult to arrange the lead LA and it is difficult to route the wiring connecting the lead LA with the land LD. Therefore, it is difficult to design the layout of the wirings of the wiring substrate WCB, and it takes time to develop the wiring substrate WCB. In addition, the cost of the semiconductor device 1 is increased. Further, it is difficult to lay out the wirings, and thus there is a case that the wiring substrate WCB is increased in size.

Accordingly, in the semiconductor device 1 of the embodiment, as shown in FIG. 3 and the like, the NSMD structure and the land-on-through-hole structure in which the lead-out wiring part is not connected with the land LD1 are adopted for each land LD1 arranged at a position not overlapping with the lead LA in transparent plan view on the outer peripheral side of the mounting surface of the wiring substrate WCB. On the other hand, not the land-on-through-hole structure but the NSMD structure and the land structure in which the lead-out wiring part WB is connected are adopted for each land LD2 overlapping with the lead LA in transparent plan view on the central side of the mounting surface of the wiring substrate WCB.

Specifically, the above-described structures are shown, for example, in the following manners. FIG. 12 is a plan view for showing a peripheral area and a central area of the mounting surface of the semiconductor device of FIG. 6, FIG. 13 is a cross-sectional view taken along the line V-V of FIG. 12, FIG. 14 is an enlarged plan view of main parts on the mounting surface of the wiring substrate of the semiconductor device of FIG. 12, and FIG. 15 is an enlarged plan view of main parts on the chip loading surface of the wiring substrate of the semiconductor device of FIG. 12. It should be noted that the chip CHP and the leads LA arranged on the mounting surface of the wiring substrate WCB are also shown in a transparent manner in FIG. 12. In addition, the solder resist SR1 is hatched in FIG. 15 in order to easily view the drawing.

In the first embodiment, as shown in FIGS. 12 and 13, the mounting surface of the wiring substrate WCB is divided into a peripheral area (first area) PA and a central area (second area) CA inside the peripheral area in the layout design of the wirings. It should be noted that the peripheral area PA and the central area CA are hatched in FIG. 12 in order to easily view the drawing.

The peripheral area PA is an area where the lands having the NSMD structure and the land-on-through-hole structure in which the lead-out wiring parts WB are not connected are arranged, and is arranged to have a width from the outer periphery of the wiring substrate WCB toward the center. The leads LA arranged in the chip loading surface of the wiring substrate WCB are arranged at positions not overlapping with the peripheral area PA in transparent plan view. That is, the leads LA arranged in the chip loading surface of the wiring substrate WCB do not overlap with the lands LD1 arranged on the outer peripheral side of the mounting surface of the wiring substrate WCB in transparent plan view. It should be noted that a concrete example of the lands having the land-on-through-hole structure arranged in the peripheral area PA will be described later.

On the other hand, the central area CA is an area where the lands having the NSMD structure and to which the lead-out wiring parts are connected are arranged, and is arranged on the inner side than the peripheral area PA while being surrounded by the peripheral area PA. The leads LA in the chip loading surface of the wiring substrate WCB are arranged at positions overlapping with the central area CA in transparent plan view. That is, the leads LA arranged in the chip loading surface of the wiring substrate WCB overlap with the lands LD2 arranged on the central side of the mounting surface of the wiring substrate WCB in transparent plan view. A concrete example of the lands having the NSMD structure arranged in the central area CA and to which the lead-out wiring parts are connected will be described later.

Further, as shown in FIGS. 12 to 15, an empty area FA is arranged between the peripheral area PA and the central area CA. The empty area FA does not belong to either the peripheral area PA or the central area CA. The distance (the shortest distance between the inner periphery of the peripheral area PA and the outer periphery of the central area CA: third distance) Fd of the empty area FA is larger than the diameter of the land LD (LD1 and LD 2).

Further, the distance Fd of the empty area FA is larger than the distance Dd (the distance Dd1 between the lands LD1 arranged along the edge of the wiring substrate WCB, or the distance Dd2 between the lands LD2 arranged along the edge of the wiring substrate WCB) between the lands LD. It should be noted that the distances Dd1 and Dd2 are equal.

Further, the distance Fd of the empty area FA is larger than the adjacent pitch Dp (the adjacent pitch Dp1 between the lands LD1 arranged along the edge of the wiring substrate WCB, or the adjacent pitch Dp2 between the lands LD2 arranged along the edge of the wiring substrate WCB) between the lands LD. It should be noted that the adjacent pitches Dp1 and Dp2 are equal.

Further, for example, there are different points of view as follows in the following manners. That is, the distance (first distance) Dsd between the lands (the first reference land and the second reference land) LD1 and LD2 arranged adjacent to each other at the closest positions among the lands LD1 and LD2 is larger than the distance Dd (the distance Dd1 between two lands LD1 adjacent along the outer peripheral direction of the wiring substrate WCB, or the distance Dd2 between two lands LD2 adjacent along the outer peripheral direction of the wiring substrate WCB) between the lands LD.

Further, the distance Dsd between the lands LD1 and LD2 is larger than the diameter of each land LD (LD1 and LD2). Further, the distance Dsd between the lands LD1 and LD2 is larger than the adjacent pitch Dp (the adjacent pitch Dp1 between two lands LD1 adjacent along the outer peripheral direction of the wiring substrate WCB, or the adjacent pitch Dp2 between two lands LD2 adjacent along the outer peripheral direction of the wiring substrate WCB) between the lands LD.

Here, the outer peripheral position (range setting) of the central area CA will be described with reference to FIG. 15. As described above, if the land LD1 (see FIG. 14) having the land-on-through-hole structure is arranged at a position overlapping with the lead LA in transparent plan view, it is difficult to route the wirings. From this viewpoint, it is conceivable that the land LD1 having the land-on-through-hole structure may be arranged at a position not overlapping with the lead LA in transparent plan view, that is, on the outer side (the outer peripheral side of the wiring substrate WCB: the right side of FIG. 15) than the lead LA1 (LA). Actually, however, the wiring parts WA on the outer side than the leads LA1 are also densely arranged. If the land LD1 having the land-on-through-hole structure is arranged while overlapping with the dense area of the wiring parts WA in transparent plan view, it is difficult to route the wirings of the wiring substrate WCB as similar to the arrangement area of the leads LA.

Accordingly, in the embodiment, the central area CA is extended to apart of the arrangement area of the wiring parts WA on the outer side than the leads LA1. That is, the outer peripheral position of the central area CA is set at the position X2 obtained by adding the length Rc2 to the length Rc1 from the center position X0 of the chip CHP to the position X1 of the outermost end of the lead LA1. The length Rc2 is equal to or larger than, for example, the diameter of each land LD (LD1 and LD2). The condition of the length Rc2 can be set to the same length condition as described for the distance Fd. By configuring as described above, the dense area of the wiring parts WA on the outer side than the leads LA1 can be also used as the arrangement area of the lands LD2 and LD3 having the NSMD structure and to which the lead-out wiring parts are connected. Thus, the wirings of the wiring substrate WCB can be easily routed.

On the other hand, for the same reason as described above, if the peripheral area PA (that is, the area where the land LD1 having the land-on-through-hole structure is arranged) enters the dense area of the wiring parts WA on the chip loading surface side of the wiring substrate WCB, it is difficult to route the wirings of the wiring substrate WCB.

Therefore, in the embodiment, the inner periphery of the peripheral area PA is defined so as to be arranged at the position X3 that is apart from the position X2 of the outer periphery of the central area CA only by the distance Fd. That is, the peripheral area PA is set at the position X3 obtained by subtracting the distance Fd from the length Rc3 from the position X4 of the outer periphery of the wiring substrate WCB to the position X2 of the outer periphery of the central area CA. By configuring as described above, the land LD1 having the land-on-through-hole structure is not arranged in the dense area of the wiring parts WA on the outer side than the leads LA. Thus, the wirings of the wiring substrate WCB can be easily routed. It should be noted that the center of the chip CHP is used as a reference when setting the boundary (the outer periphery and the inner periphery) positions of the peripheral area PA and the central area CA in the above example. However, the present invention is not limited thereto. For example, the position of the center of the wiring substrate WCB, the position of the outer periphery of the wiring substrate WCB, or the already-determined boundary position of the peripheral area PA or the central area CA may be used as a reference.

Next, a structural example of the lands LD (LD1 to LD3) arranged in the central area CA and the peripheral area PA of the mounting surface of the semiconductor device 1 in the first embodiment will be described. The left side of FIG. 16 is a plan view of main parts of the lands arranged in the central area of the mounting surface of the semiconductor device, the right side of FIG. 16 is a plan view of main parts of the land arranged in the peripheral area of the mounting surface of the semiconductor device, the left side of FIG. 17 is a cross-sectional view taken along the line VI-VI on the left side of FIG. 16, and the right side of FIG. 17 is a cross-sectional view taken along the line VII-VII on the right side of FIG. 16. It should be noted that the solder resist SR2 is hatched in FIG. 16 in order to easily view the drawing.

As shown on the left sides of FIGS. 16 and 17, the lands LD2 and LD3 having the NSMD structure and to which the lead-out wiring parts WB are connected are arranged in the central area CA of the wiring substrate WCB of the semiconductor device 1. That is, an opening portion (second opening portion) KB2 (KB) having a diameter larger than the lands LD2 and LD3 and including the lands LD2 and LD3 is formed in the solder resist SR2. In addition, the lands LD2 and LD3 and a part of the wiring part WB connected thereto are exposed from the opening portion KB2. The diameter of the opening portion KB2 is the same as the opening portions KB and KB1.

The lands LD2 and LD3 are electrically connected with the through-hole land TLB formed on the mounting surface of the substrate SB through the lead-out wiring part WB formed on the mounting surface of the substrate SB. The through-hole land TLB is electrically connected with the through-hole land TLA formed on the chip loading surface of the substrate SB through the through-hole wirings WT2. Each of the through-hole wirings WT2 is formed in the entire inner wall surface of a through-hole TH2 drilled in the substrate SB while being covered with a conductive film such as copper (Cu) or the like. An insulating film Fi is filled inside the conductive film for the through-hole wiring WT2 in the through-hole TH2. The insulating film Fi is formed of, for example, resin.

As described above, the lands LD having the NSMD structure and to which the lead-out wiring parts WB are connected are arranged in the central area CA of the wiring substrate WCB. Thus, the leads LA and the lands LD can be satisfactorily connected with each other without confusing the routing of the wirings. Therefore, it is possible to improve the degree of freedom of the wiring design of the wiring substrate WCB where high-density wirings are arranged. Therefore, it is possible to shorten the development period of the semiconductor device 1. Further, since the wirings of the wiring substrate WCB can be densely arranged, it is possible to promote miniaturization of the semiconductor device 1. Further, the cost of the semiconductor device 1 can be reduced.

Next, as shown on the right sides of FIGS. 16 and 17, the land LD1 having the NSMD structure and the land-on-through-hole structure in which the lead-out wiring part WB is not connected with the land is arranged in the peripheral area PA of the wiring substrate WCB of the semiconductor device 1. That is, the opening portion (first opening portion) KB1 (KB) having a diameter larger than the land LD1 and including the land LD1 is formed in the solder resist SR2. Since the lead-out wiring part WB is not connected with the land LD1, the upper surface and the entire side surface of land LD1 are exposed from opening portion KB1.

Further, the land LD1 formed on the mounting surface of the substrate SB is electrically connected with the through-hole land TLA formed on the chip loading surface of the substrate SB through the through-hole wirings WT1. Each of the through-hole wirings WT1 is also formed in the entire inner wall surface of a through-hole TH1 drilled in the substrate SB while being covered with a conductive film such as copper (Cu) or the like. Further, in this case, the insulating film Fi formed of resin or the like is also filled inside the conductive film for the through-hole wiring WT1 in the through-hole TH1.

As described above, the land LD1 having the NSMD structure and the land-on-through-hole structure in which the lead-out wiring part WB is not connected is arranged in the peripheral area PA where relatively-large thermal stress is applied in the wiring substrate WCB. Accordingly, it is possible to improve the bonding strength between the land LD1 and the solder ball BE on the outer peripheral side of the mounting surface of the wiring substrate WCB, and thus the occurrence of the cracks in the solder ball BE can be suppressed or prevented. Therefore, the connecting reliability between the semiconductor device 1 and the mother board can be improved.

However, the structure of the through-hole wiring WT is not limited to the above-described one. The left side of FIG. 18 shows a modified example of the through-hole wiring, and is a cross-sectional view of a part corresponding to the line VI-VI on the left side of FIG. 16. The right side of FIG. 18 shows a modified example of the through-hole wiring, and is a cross-sectional view of a part corresponding to the line VII-VII on the right side of FIG. 16. Here, the through-holes TH1 and TH2 are filled with not the insulating films Fi but, for example, metal films such as copper (Cu) or the like. That is, the through-hole wirings WT1 and WT2 in FIG. 18 are formed by embedding only the metal films into the through-holes TH1 and TH2.

<Manufacturing Method of Semiconductor Device>

Next, an example of a MAP method (collective molding method) for manufacturing the semiconductor device 1 of the first embodiment will be described with reference to FIGS. 20 to 28 along the process diagram of FIG. 19.

1. Back Grind

First, the back surface of a semiconductor wafer (hereinafter, simply referred to as a wafer WF) having a chip area where an integrated circuit is formed by forming an integrated circuit element such as a transistor (MISFET (Metal Insulator Semiconductor Field Effect Transistor)) or the like and a multilayer wiring by using an ordinary semiconductor manufacturing technique is ground (back grind: S101 in FIG. 19) as shown in FIG. 20. That is, after the element formation surface (top surface) of the wafer WF is covered with a protection tape PT, the wafer WF is arranged on a stage while allowing the back surface on the opposite side of the element formation surface (top surface) of the wafer WF to face upward. Next, the back surface of the wafer WF is ground by a grinder G to reduce the thickness of the wafer WF. Accordingly, the wafer WF is ground.

2. Wafer Dicing

Thereafter, as shown in FIG. 21, the wafer WF is diced to be divided into chips (S102 in FIG. 19). That is, first, a dicing tape DT is allowed to adhere to a concentric dicing frame DFM, and then the wafer WF is arranged on the dicing tape DT. Next, the wafer WF is cut along a dicing line by using dicing blade DS that rotate, so that the wafer WF is divided into chips.

3. Die Bonding

Next, as shown in FIG. 22, the divided chips CHP are mounted on the wiring substrate WCB (die bonding: S103 in FIG. 19). That is, after each chip CHP is adsorbed by a collet C1, the chips CHP are mounted on the wiring substrate WCB through a die bond material DB. At this time, the wiring substrate WCB is integrated so as to form a plurality of semiconductor devices, and each chip CHP is mounted in the area where each semiconductor device is obtained. Thereafter, heat treatment (baking) is performed to increase the adhesion strength between the chips CHP and the wiring substrate WCB.

4. Plasma Cleaning

Next, plasma cleaning is performed on the surface (chip loading surface) of the wiring substrate WCB on which the chips CHP are mounted (S104 in FIG. 19). The plasma cleaning is performed for the purpose of improving the adhesion between resin and the wiring substrate WCB in the subsequent molding process. It should be noted that in the case where resin that is excellent (high) in adhesion to the wiring substrate WCB is used, the plasma cleaning process may be omitted.

5. Wire Bonding

Thereafter, as shown in FIG. 23, the leads formed on the wiring substrate WCB and the pads of the chips CHP are connected with each other by the wires BW made of, for example, gold (S105 in FIG. 19). Specifically, after the wire BW is first bonded to the pad of the chip CHP with a capillary C2, the capillary C2 is moved, so that the wire BW is second bonded to the lead of the wiring substrate WCB.

Accordingly, the leads of the wiring substrate WCB and the pads of the chips CHP are electrically connected with each other by the wires BW. It should be noted that the wires BW to be used may be wires made of material containing not gold (Au) but copper (Cu) as a main component.

6. Mold

Next, as shown in FIG. 24, the entire chip loading surface of the wiring substrate WCB is sealed with resin M (S106 in FIG. 19). Specifically, the wiring substrate WCB on which the chips CHP are mounted is sandwiched between an upper mold UK and a lower mold BK from the upper and lower directions so that the chips CHP mounted on the wiring substrate WCB are located in one cavity (recess) formed in the lower mold BK, and the resin M is poured from an insertion opening into the mold space of the lower mold BK. Accordingly, the chips CHP on the wiring substrate WCB are collectively sealed with the resin M. Thereafter, in order to cure the resin M, heat treatment (baking) is performed for the wiring substrate WCB. It should be noted that instead of the lower mold BK, a molding die provided in the upper mold UK may be used as the above-described cavity.

7. Solder Printing

Next, as shown in FIG. 25, a solder paste SP is applied to the back surface of the wiring substrate WCB by means of solder printing (S107 in FIG. 19). Specifically, a metal mask MSK is arranged on the back surface of the wiring substrate WCB, and the solder paste SP is printed on the metal mask MSK with a squeegee S1. Accordingly, as shown in FIG. 26, the solder pastes SP are formed on the lands LD (lands LD1 to LD3: see FIG. 3 and the like) of the wiring substrate WCB. Thereafter, as shown in FIG. 27, the solder pastes SP formed on the back surface of the wiring substrate WCB are made into the hemispherical solder balls BE by reflowing the wiring substrate WCB. As described above, external connection terminals configured using the solder balls BE are formed on the back surface of the wiring substrate WCB. It should be noted that the method of forming the external connection terminals (solder balls BE) is not limited to the above-described solder printing method, but a so-called ball supply method in which the solder balls formed in a spherical shape are supplied onto the lands and are melted by heating to be connected with the lands may be adopted.

8. Package Dicing

Thereafter, as shown in FIG. 28, the wiring substrate WCB is diced (package dicing: S108 in FIG. 19). That is, first, after the dicing tape DT is allowed to adhere to the concentric dicing frame DFM, the wiring substrate WCB after the collective molding is arranged on the dicing tape DT. Next, each semiconductor device 1 is obtained by cutting the wiring substrate WCB using the dicing blades DS that rotate at high speed. As described above, the semiconductor device 1 having the BGA package structure shown in FIG. 1, FIG. 2, and the like can be manufactured. The chip loading surface of the wiring substrate WCB of the semiconductor device 1 is sealed with the resin sealing body MD configured using the resin M. On the other hand, the external connection terminals configured using the solder balls BE are formed on the mounting surface on the opposite side of the chip loading surface of the wiring substrate WCB. Thereafter, the semiconductor device 1 having the BGA package structure is housed and shipped.

<Example of Mounting Structure of Semiconductor Device>

Next, a mounting example of the semiconductor device 1 manufactured as described above will be described with reference to FIG. 29. FIG. 29 is a cross-sectional view of main parts of the semiconductor device of FIG. 1 and the mother board on which the semiconductor device is mounted.

First, a solder paste (welding solder) is formed on a land MLD formed on a mother board MCB. The land structure on the mother board MCB side has, for example, the SMD structure shown in FIG. 8. That is, an opening portion KC smaller than the diameter of the land MLD of the mother board MCB is formed in a solder resist SR3 formed on the device loading surface of the mother board MCB while being included in the land MLD.

Next, the solder ball BE of the mounting surface of the semiconductor device 1 and the land MLD of the mother board MCB are connected with each other through a solder paste in a state where the mounting surface of the semiconductor device 1 faces the mother board MCB. Thereafter, the solder ball BE of the semiconductor device 1 and the solder paste on the land MLD of the mother board MCB are integrated by reflowing (heat treatment) the mother board MCB and the semiconductor device 1, so that the semiconductor device 1 is mounted on the mother board MCB.

After such a mounting process, a temperature cycle test or the like is conducted for the semiconductor device 1. The temperature cycle test is conducted under the conditions of, for example, 2000 cycles in the range of −55° C. (or −40° C.) to 125° C. At this time, the land-on-through-hole structure is adopted for the land structure on the outer peripheral side of the mounting surface of the semiconductor device 1 where the thermal stress is relatively large in the semiconductor device 1 of the embodiment, and thus the present invention can sufficiently cope with the temperature environment of temperature cycle test. That is, since the cracks of the solder ball BE on the outer peripheral side of the mounting surface of the semiconductor device 1 can be suppressed or prevented in the semiconductor device 1 of the first embodiment, the bonding strength between the solder ball BE of the semiconductor device 1 and the land MLD of the mother board MCB can be improved. Therefore, the yield of the semiconductor device 1 can be improved.

Further, as described above, a space is provided between the land LD1 and the land LD2 and between the land LD2 and the land LD3 of the mounting surface of the semiconductor device 1 in the embodiment. Therefore, the wiring part WD connected with the land MLD of the mother board MCB can be extracted to an area (position) facing the distances between the land LD1 and the land LD2 and between the land LD2 and the land LD3 of the semiconductor device 1 in the mother board MCB. Therefore, the degree of freedom of routing the wirings on the mother board MCB side can be improved. Here, a through-hole MTH orthogonal to the upper and lower surfaces of the mother board MCB and a through-hole wiring MWT formed therein are arranged in the area (position) facing the distances between the land LD1 and the land LD2 and between the land LD2 and the land LD3 of the semiconductor device 1 in the mother board MCB.

Here, the configuration of the first embodiment can be also applied to a semiconductor device manufactured by, for example, an individual mold method. However, as shown in FIG. 30, in the case where a resin sealing body MD0 is not formed up to the outer solder balls BE in the mounting surface of the wiring substrate WCB of the semiconductor device 1 in the individual mold method, the stress applied to the outer peripheral side of the wiring substrate WCB at the time of the temperature cycle test or the like is smaller than that of a semiconductor device manufactured by a MAP mold method. In the case of the semiconductor device manufactured by the individual mold method shown in FIG. 30, even if thermal stress is applied to the outer peripheral side of the wiring substrate WCB, there is an escape place as indicated by an arrow P1 against the thermal stress. On the other hand, in the semiconductor device 1 manufactured by the MAP mold method shown in FIG. 31, since the entire area of the chip loading surface of the wiring substrate WCB is covered with the resin sealing body MD, the escape against the thermal stress is small and the thermal stress concentrates on the solder balls BE. Thus, the configuration of the first embodiment can be also applied to the semiconductor device manufactured by the individual mold method, but exhibits an effect particularly in the semiconductor device 1 manufactured by the MAP mold method.

Further, the configuration of the first embodiment can be also applied to a semiconductor device having, for example, an LGA (Land Grid Array) package structure. In the case of the LGA, the surface of the land LD is covered with a solder material thinner than the solder ball. However, the bonding defect of the solder ball is a serious problem particularly in the semiconductor device having the BGA package structure. Therefore, the configuration of the first embodiment can be also applied to the semiconductor device having the LGA package structure, but exhibits an effect particularly in the semiconductor device having the BGA package structure.

Second Embodiment

FIG. 32 is a plan view for showing a peripheral area, a first central area, and a second central area on the mounting surface of the semiconductor device of FIG. 6, FIG. 33 is a cross-sectional view taken along the line VIII-VIII of FIG. 32, FIG. 34 is an enlarged cross-sectional view of main parts of the semiconductor device of FIG. 33, and FIG. 35 is an enlarged plan view of main parts of the chip loading surface of the wiring substrate of the semiconductor device of FIG. 32.

In the second embodiment, as shown in FIGS. 32 and 33, the mounting surface of a wiring substrate WCB is divided into a peripheral area (first area) PA, a first central area (second area) CA1 inside the peripheral area, and a second central area (third area) CA2 inside the first central area in the layout design of the wirings. It should be noted that a chip CHP and a plurality of leads LA arranged on the mounting surface of the wiring substrate WCB are also shown in a transparent manner in FIG. 32. Further, the peripheral area PA, the first central area CA1, and the second central area CA2 are hatched in FIG. 32 in order to easily view the drawing. Furthermore, since the peripheral area PA is the same as that explained in the first embodiment, the explanation thereof will be omitted.

The first central area CA1 is an area where lands LD2 having the NSMD structure and to which lead-out wiring parts WB are connected are arranged, and is arranged inside the peripheral area PA while being surrounded by the peripheral area PA. The first central area CA1 is arranged between the peripheral area PA and the second central area CA2. The leads LA in the chip loading surface of the wiring substrate WCB are arranged at positions overlapping with the first central area CA1 in transparent plan view. That is, the leads LA arranged in the chip loading surface of the wiring substrate WCB overlap with the lands LD2 arranged on the mounting surface of the wiring substrate WCB in transparent plan view. The structure of each land arranged in the first central area CA1 corresponds to the structure exemplified on the left side of each of FIGS. 16 to 18.

It should be noted that an empty area FA1 is arranged between the first central area CA1 and the peripheral area PA. However, the empty area FA1 and the distance Fd1 thereof are the same as the empty area FA and the distance Fd thereof in the first embodiment, and thus the explanation thereof will be omitted. Further, the distance Dsd (see FIG. 14) between the lands (the first reference land and the second reference land) LD1 and LD2 arranged at positions closest to each other among the lands LD1 and LD2 is also the same as that in the first embodiment, and thus the explanation thereof will be omitted. Furthermore, the definition of the outer peripheral position of the first central area CA1 is the same as that of the outer peripheral position of the central area CA of the first embodiment, and thus the explanation thereof will be omitted.

The second central area CA2 is arranged inside the first central area CA1 while being surrounded by the first central area CA1. The second central area CA2 is slightly larger than the plane area of the chip CHP, and is arranged while including the chip CHP in transparent plan view. The leads LA in the chip loading surface of the wiring substrate WCB do not overlap with the second central area CA2 in transparent plan view. That is, the leads LA arranged in the chip loading surface of the wiring substrate WCB do not overlap with a plurality of lands (third lands) LD4 arranged in the second central area CA2 of the mounting surface of the wiring substrate WCB in transparent plan view. Therefore, the lands LD4 arranged in the second central area CA2 may have the NSMD structure and the land-on-through-hole structure, the NSMD structure and the land structure in which the lead-out wiring parts WB are connected, or both structures. In this case, as shown in FIG. 34, the lands LD4 arranged in the second central area CA2 have, for example, the NSMD structure and the land-on-through-hole structure.

That is, an opening portion (third opening portion) KB3 (KB) having a larger diameter than the land LD4 and including the land LD4 is formed in a solder resist SR2. Since the lead-out wiring part WB is not connected with the land LD4, the upper surface and the entire side surface of the land LD4 are exposed from the opening portion KB3. Further, the land LD4 is electrically connected with a through-hole land TLA formed on the chip loading surface of a substrate SB through a through-hole wiring (third through-hole wiring) WT3 (WT) formed in a through-hole (third through-hole) TH3 (TH). It should be noted that the concrete structure of the land LD4 is the same as the structure exemplified on the right side of each of FIGS. 16 to 18. Further, the diameter of the opening portion KB3 is the same as that of the opening portion KB (KB1 and KB2). Furthermore, the diameter of the through-hole TH3 is the same as that of the through-hole TH (TH1 and TH2).

In addition to the effects obtained in the first embodiment, the following effects can be obtained in the second embodiment. That is, since the wiring lengths of signal wirings can be shortened by using the lands LD4 having the land-on-through-hole structure and the through-hole wirings WT3 arranged directly under the chip CHP as the signal wirings, the operation speed of the semiconductor device 1 can be improved. Further, the lands LD4 having the land-on-through-hole structure and the through-hole wirings WT3 arranged directly under the chip CHP may be used as power supply wirings (power supply wirings on the high potential side and power supply (for example, 0V at GND) wirings on the reference potential side). Accordingly, since the wiring lengths of the power supply wirings can be shortened, stable power supply potential can be supplied to the integrated circuit of the chip CHP. Therefore, the operation reliability of the semiconductor device 1 can be improved. Further, since the dissipation of heat generated in the chip CHP during the operation of the semiconductor device 1 can be improved by allowing the through-hole wirings WT3 arranged directly under the chip CHP to have a metal-filled structure shown in FIG. 18, the operation reliability of the semiconductor device 1 can be improved.

Further, an empty area FA2 is arranged even between the second central area CA2 and the first central area CA1. The distance (fourth distance) Fd2 of the empty area FA2 is the same as the distance Fd of the empty area FA in the first embodiment, and thus the explanation thereof will be omitted. The distance (second distance) between the lands (the third reference land and the fourth reference land) LD2 and LD4 arranged at positions closest to each other among the lands LD2 of the first central area CA1 and the lands LD4 of the second central area CA2 is the same as the distance Dsd (see FIG. 14) between the lands LD1 and LD2 described in the first embodiment, and thus the explanation thereof will be omitted.

Here, the inner peripheral position (range setting) of the first central area CA will be described with reference to FIG. 35. It should be noted that a solder resist SR1 is hatched in FIG. 35 in order to easily view the drawing.

As similar to the above, it is conceivable that the land having the land-on-through-hole structure may be arranged on the inner side (the central side of the wiring substrate WCB: the left side of FIG. 35) than the leads LA2 (LA). Actually, however, the wiring parts WA on the inner side than the leads LA2 are also densely arranged. Thus, if the land having the land-on-through-hole structure is arranged while overlapping with the dense area of the wiring parts WA in transparent plan view, it is difficult to route the wirings of the wiring substrate WCB as similar to the arrangement area of the leads LA.

Accordingly, in the second embodiment, the inner peripheral side of the first central area CA1 is extended to a part of the arrangement area of the wiring parts WA on the inner side than the leads LA2. That is, the inner peripheral position of the first central area CA1 is set at the position X6 obtained by subtracting the length Rc5 from the length Rc4 from the center position X0 of the chip CHP to the innermost end of the lead LA2. The length Rc5 is equal to or larger than, for example, the diameter of each land LD (LD1 to LD4). The condition of the length Rc5 can be set to the same length condition as described for the distance Fd of the first embodiment. By configuring as described above, the dense area of the wiring parts WA on the inner side than the leads LA2 can be also used as the arrangement area of the lands LD2 having the NSMD structure and to which the lead-out wiring parts WB are connected. Thus, the wirings of the wiring substrate WCB can be easily routed.

On the other hand, the lands LD4 having the land-on-through-hole structure are arranged in the second central area CA2. Thus, for the same reason as described above, if the second central area CA2 enters the dense area of the wiring parts WA on the chip loading surface of the wiring substrate WCB, it is difficult to route the wirings of the wiring substrate WCB.

Therefore, in the second embodiment, the outer periphery of the second central area CA2 is defined so as to be arranged at the position X7 that is apart from the position X6 of the inner periphery of the first central area CA1 only by the distance Fd2. That is, the second central area CA2 is set at the position X7 obtained by subtracting only the distance Fd2 from the length Rc6 from the center position X0 of the chip CHP to the position X6 of the inner periphery of the first central area CA1. By configuring as described above, the land LD4 having the land-on-through-hole structure is not arranged in the dense area of the wiring parts WA on the inner side than the leads LA2. Thus, the wirings of the wiring substrate WCB can be easily routed. It should be noted that the center of the chip CHP is used as a reference when setting the boundary (the outer periphery and the inner periphery) positions of the first central area CA1 and the second central area CA2 in the above example. However, the present invention is not limited thereto. For example, the position of the center of the wiring substrate WCB, the position of the outer periphery of the wiring substrate WCB, or the already-determined boundary position of the peripheral area PA, the first central area CA1, or the second central area CA2 may be used as a reference.

The invention made by the inventors has been concretely described above on the basis of the embodiments. However, it is obvious that the present invention is not limited to the above-described embodiments, and can be variously changed without departing from the gist thereof.

What is claimed is:

1. A semiconductor device comprising:
   a wiring substrate including a base material having a first surface and a second surface opposite to the first surface, a plurality of leads arranged on the first surface of the base material, a first insulating film provided on the first surface of the base material such that the plurality of leads is exposed, a plurality of lands arranged on the second surface of the base material, a second insulating film provided on the second surface of the base material such that the plurality of lands is exposed, a plurality of through-holes each penetrating between the first surface and the second surface of the base material, and a plurality of through-hole wirings formed inside the plurality of through holes, respectively, and electrically connecting the plurality of leads with the plurality of lands, respectively;
   a semiconductor chip having a third surface, a plurality of electrodes formed on the third surface, and a fourth surface opposite to the third surface, and mounted over the first surface of the wiring substrate such that the fourth surface faces the first surface of the base material;
   a plurality of wires electrically connecting the plurality of electrodes of the semiconductor chip with the plurality of leads of the wiring substrate, respectively;
   a resin sealing body sealing the semiconductor chip and the plurality of wires; and
   an external terminal provided on each of the plurality of lands,
   wherein the plurality of lands has:
      a plurality of first lands that does not overlap with the plurality of leads in transparent plan view and that is arranged along an edge of the base material, and
      a plurality of second lands that is located on the inner side than the plurality of first lands in plan view, that overlaps with the plurality of leads in transparent plan view, and that is arranged along the edge of the base material,
   wherein a wiring part formed on the second surface of the base material is connected to each of the plurality of second lands,
   wherein the plurality of second lands has a second reference land located closest to a first reference land among the plurality of first lands,
   wherein a first distance between the first reference land and the second reference land is larger than a distance between two lands, that are adjacent to each other along the edge of the base material, among the plurality of first lands,
wherein the plurality of through-hole wirings has:
  a first through-hole wiring electrically connected with the first land, and
  a second through-hole wiring electrically connected with the second land via the wiring part,
wherein a first through-hole, inside which the first through-hole wiring is formed, among the plurality of through holes overlaps with the first land in plan view,
wherein a second through-hole, inside which the second through-hole wiring is formed, among the plurality of through-holes does not overlap with the second land in plan view,
wherein a plurality of opening portions that respectively exposes the plurality of lands such that the plurality of lands is respectively located within the plurality of opening portions in plan view is formed in the second insulating film, and
wherein the plurality of opening portions has:
  a first opening portion exposing the first land, and
  a second opening portion exposing the second land and a part of the wiring part.

2. The semiconductor device according to claim 1, wherein the diameter of each of the plurality of lands is larger than an adjacent distance between the plurality of leads.

3. The semiconductor device according to claim 1, wherein the plurality of first lands and the plurality of second lands are arranged in plural rows.

4. The semiconductor device according to claim 1, wherein the resin sealing body covers the entire area of the first surface of the base material.

5. The semiconductor device according to claim 1, wherein the first distance is larger than the diameter of each of the plurality of lands.

6. The semiconductor device according to claim 1, wherein the first distance is larger than an adjacent pitch between two lands, that are adjacent to each other along the edge of the base material, among the plurality of first lands.

7. The semiconductor device according to claim 1, wherein the plurality of lands has a plurality of third lands arranged along the edge of the base material at a position that is an area surrounded by the arrangement area of the plurality of second lands and that does not overlap with the plurality of leads in transparent plan view,
wherein the plurality of third lands has a fourth reference land located closest to a third reference land among the plurality of second lands, and
wherein a second distance between the third reference land and the fourth reference land is larger than a distance between two lands, that are adjacent to each other along the edge of the base material, among the plurality of first lands.

8. The semiconductor device according to claim 7, wherein the plurality of third lands overlap with the semiconductor chip in transparent plan view.

9. The semiconductor device according to claim 7, wherein the plurality of through-hole wirings has a third through-hole wiring electrically connected with the third land,
wherein a third through-hole, inside which the third through-hole wiring is formed, among the plurality of through-holes overlaps with the third land in plan view, and
wherein the plurality of opening portions of the second insulating film has a third opening portion that exposes the third land such that the third land is located within the third opening portion in plan view.

10. A semiconductor device comprising:
a wiring substrate including a base material having a first surface and a second surface opposite to the first surface, a plurality of leads arranged on the first surface of the base material, a first insulating film provided on the first surface of the base material such that the plurality of leads is exposed, a plurality of lands arranged on the second surface of the base material, a second insulating film provided on the second surface of the base material such that the plurality of lands is exposed, a plurality of through-holes each penetrating between the first surface and the second surface of the base material, and a plurality of through-hole wirings formed inside the plurality of through-holes, respectively, and electrically connecting the plurality of leads with the plurality of lands, respectively;
a semiconductor chip having a third surface, a plurality of electrodes formed on the third surface, and a fourth surface opposite to the third surface, and mounted over the first surface of the wiring substrate;
a plurality of wires electrically connecting the plurality of electrodes of the semiconductor chip with the plurality of leads of the wiring substrate, respectively;
a resin sealing body sealing the semiconductor chip and the plurality of wires; and
an external terminal provided on each of the plurality of lands,
wherein the plurality of leads does not overlap with a first area on the outer peripheral side on the second surface of the base material in transparent plan view, but overlaps with a second area on the inner side than the first area in transparent plan view,
wherein the plurality of lands has:
  a plurality of first lands arranged along an edge of the base material in the first area, and
  a plurality of second lands arranged along the edge of the base material in the second area,
wherein a wiring part formed on the second surface of the base material is connected to each of the plurality of second lands,
wherein a third distance between the first area and the second area is larger than a distance between two lands that are adjacent to each other along the edge of the substrate among the first lands,
wherein the plurality of through-hole wirings has:
  a first through-hole wiring electrically connected with the first land, and
  a second through-hole wiring electrically connected with the second land via the wiring part,
wherein a first through-hole, inside which the first through-hole wiring is formed, among the plurality of through-holes overlaps with the first land in plan view,
wherein a second through-hole, inside which the second through-hole wiring is formed, among the plurality of through-holes does not overlap with the second land in plan view,
wherein a plurality of opening portions that respectively exposes the plurality of lands such that the plurality of lands is respectively located within the plurality of opening portions in plan view is formed in the second insulating film, and wherein the plurality of opening portions has:
- a first opening portion exposing the first land, and
- a second opening portion exposing the second land and a part of the wiring part.

11. The semiconductor device according to claim 10, wherein the diameter of the land is larger than an adjacent distance between the leads.

12. The semiconductor device according to claim 10, wherein the first lands and the second lands are arranged while forming a plurality of rows.

13. The semiconductor device according to claim 10, wherein the resin sealing body covers the entire area of the first surface of the substrate.

14. The semiconductor device according to claim 10, wherein the third distance is larger than the diameter of the land.

15. The semiconductor device according to claim 10, wherein the third distance is larger than a distance between two lands that are adjacent to each other along the edge of the substrate among the first lands.

16. The semiconductor device according to claim 10, wherein the lands have a plurality of third lands arranged along the edge of the substrate in a third area that is located on the inner side than the second area and does not overlap with the leads in transparent plan view, and wherein a fourth distance between the second area and the third area is larger than a distance between two lands that are adjacent to each other along the edge of the substrate among the first lands.

17. The semiconductor device according to claim 16, wherein the third lands overlap with the semiconductor chip in transparent plan view.

18. The semiconductor device according to claim 16, wherein the through-hole wirings have a third through-hole wiring electrically connected with the third land, wherein a third through-hole, inside which the third through hole wiring is formed among the through-holes overlaps with the third land in plan view, and wherein the opening portions of the second insulating film have a third opening portion exposing the third land while being included in plan view.

* * * * *